United States Patent
Fukuzawa

(10) Patent No.: US 10,270,452 B2
(45) Date of Patent: Apr. 23, 2019

(54) CIRCUIT DEVICE, OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 177 days.

(21) Appl. No.: 15/341,351

(22) Filed: Nov. 2, 2016

(65) Prior Publication Data

US 2017/0141778 A1 May 18, 2017

(30) Foreign Application Priority Data

Nov. 12, 2015 (JP) .................................. 2015-221729

(51) Int. Cl.
| | |
|---|---|
| H03L 1/04 | (2006.01) |
| H03L 1/02 | (2006.01) |
| H03L 5/00 | (2006.01) |
| H03L 1/00 | (2006.01) |

(52) U.S. Cl.
CPC .................. *H03L 1/04* (2013.01); *H03L 1/00* (2013.01); *H03L 1/026* (2013.01); *H03L 1/028* (2013.01); *H03L 5/00* (2013.01)

(58) Field of Classification Search
CPC ... H03L 1/04; H03L 1/028; H03L 5/00; H03L 1/00; H03L 1/026
USPC .................... 331/158, 116 FE, 175, 176, 185
See application file for complete search history.

(56) References Cited

U.S. PATENT DOCUMENTS

| | | | | |
|---|---|---|---|---|
| 5,777,524 A | * | 7/1998 | Wojewoda | ............. H03B 5/368 331/116 R |
| 6,131,073 A | * | 10/2000 | Honda | ..................... G01R 1/44 330/272 |
| 6,593,823 B2 | | 7/2003 | Nakamiya et al. | |

(Continued)

FOREIGN PATENT DOCUMENTS

| | | |
|---|---|---|
| JP | 64-082809 A | 3/1989 |
| JP | 06-326598 A | 11/1994 |

(Continued)

*Primary Examiner* — Arnold Kinkead
(74) *Attorney, Agent, or Firm* — Harness, Dickey & Pierce, P.L.C.

(57) ABSTRACT

A circuit device includes a power supply circuit and a digital temperature compensated oscillation circuit. The digital temperature compensated oscillation circuit includes an A/D conversion unit, a processing unit, and an oscillation signal generation circuit. The A/D conversion unit performs A/D conversion of a temperature detection voltage from a temperature sensor unit. The processing unit performs temperature compensation processing of an oscillation frequency based on temperature detection data. The oscillation signal generation circuit generates an oscillation signal of the oscillation frequency using frequency control data and a vibrator. The power supply circuit includes at least one reference voltage generation circuit that generates a reference voltage based on a work function difference between transistors. The power supply circuit supplies the reference voltage generated by the reference voltage generation circuit to the digital temperature compensated oscillation circuit as a power supply voltage.

15 Claims, 15 Drawing Sheets

(56) References Cited

U.S. PATENT DOCUMENTS

| | | | |
|---|---|---|---|
| 7,633,350 B2* | 12/2009 | Nagatomo | H03L 1/022 331/116 R |
| 2015/0276853 A1 | 10/2015 | Murashima et al. | |
| 2016/0211853 A1* | 7/2016 | Fukuzawa | H03L 1/00 |

FOREIGN PATENT DOCUMENTS

| | | |
|---|---|---|
| JP | 2003-152449 A | 5/2003 |
| JP | 2008-029036 A | 2/2008 |
| JP | 2012-199631 A | 10/2012 |
| JP | 2015-184208 A | 10/2015 |

* cited by examiner

CIRCUIT DEVICE, OSCILLATOR, ELECTRONIC APPARATUS, AND MOVING OBJECT

BACKGROUND

1. Technical Field

The present disclosure relates to a circuit device, an oscillator, an electronic apparatus, a moving object, and the like.

2. Related Art

A temperature compensated oscillator called a temperature compensated crystal oscillator (TCXO) is known. The TCXO is used as a reference signal source in, for example, a portable communication terminal, a GPS related apparatus, a wearable apparatus, an on-vehicle apparatus, or the like.

The TCXO includes an ATCXO which is an analog temperature compensated oscillator and a DTCXO which is a digital temperature compensated oscillator. An example of an ATCXO is disclosed in JP-A-2012-199631. An example of a DTCXO is disclosed in JP-A-64-82809.

Since an oscillator, such as a TCXO, requires extremely high frequency accuracy, a power supply having characteristics, such as low noise and low temperature characteristics, is used. In an analog oscillator, such as an ATCXO, a linear regulator of a low drop-out (LDO) system is used as an external power supply. An internal power supply circuit can be constituted of a linear regulator of an LDO system which uses an output of a bandgap reference circuit as a reference voltage. In such a circuit configuration, while a power supply having low noise and low temperature characteristics is obtained, reduction in power consumption is difficult. For example, a linear regulator used as an external power has a power consumption larger than a switching regulator. If a switching regulator is used as an external power supply, since power consumption can be lowered but has noise larger than that of the linear regulator, an internal power supply circuit requires a high power supply rejection ratio (PSRR). The bandgap reference circuit used in the internal power supply circuit is difficult to maintain in a high PSRR when current consumption decreases, and it is difficult to reduce power consumption in a low noise condition.

SUMMARY

An advantage of some aspects of the present disclosure is to provide a circuit device, an oscillator, an electronic apparatus, a moving object, and the like capable of realizing a digital oscillator, such as a DTCXO, that allows reduction in power consumption of a power supply.

An aspect of the present disclosure relates to a circuit device including: a power supply circuit to which external power is supplied and that includes at least one reference voltage generation circuit generating a reference voltage based on a work function difference between transistors, and the power supply circuit supplies the reference voltage generated by the reference voltage generation circuit as a power supply voltage; and a digital temperature compensated oscillation circuit that is operated when the power supply voltage is supplied from the power supply circuit. The digital temperature compensated oscillation circuit includes: an A/D conversion unit that performs analog-to-digital (A/D) conversion of a temperature detection voltage from a temperature sensor unit and outputs temperature detection data; a processing unit that performs temperature compensation processing of an oscillation frequency based on the temperature detection data and outputs frequency control data of the oscillation frequency; and an oscillation signal generation circuit that generates an oscillation signal of the oscillation frequency set by the frequency control data using the frequency control data from the processing unit and a vibrator.

According to the aspect of the present disclosure, the reference voltage is generated based on the work function difference between the transistors, and the reference voltage is supplied to the digital temperature compensated oscillation circuit as a power supply voltage. The reference voltage is generated based on the work function difference between the transistors, whereby it is possible to maintain a high PSRR while decreasing current consumption, for example, compared to a case where a bandgap reference circuit or the like is used. With this, it is possible to realize a digital oscillator, such as a DTCXO, allowing reduction in power consumption of a power supply.

In an aspect of the present disclosure, the oscillation signal generation circuit may include: a digital-to-analog (D/A) conversion unit that performs D/A conversion on the frequency control data and outputs a frequency control voltage of the oscillation frequency; and an oscillation circuit that oscillates the vibrator at the oscillation frequency based on the frequency control voltage. The power supply circuit may include, as the at least one reference voltage generation circuit, at least one of: a first reference voltage generation circuit that supplies a first reference voltage generated based on the work function difference to the A/D conversion unit as a first power supply voltage, a second reference voltage generation circuit that supplies a second reference voltage generated based on the work function difference to the processing unit as a second power supply voltage, and a third reference voltage generation circuit that supplies a third reference voltage generated based on the work function difference to the D/A conversion unit as a third power supply voltage.

According to the aspect of the present disclosure with this configuration, at least one reference current generation circuit among the first reference voltage generation circuit, the second reference voltage generation circuit, and the third reference voltage generation circuit respectively corresponding to the A/D conversion unit, the processing unit, and the D/A conversion unit is provided. With this, since the power supply lines of the respective units can be separated from one another, it is possible to suppress propagation of noise through the power supply lines and to improve oscillation signal accuracy (e.g., phase noise characteristics). In the aspect of the present disclosure with the configuration described above, since temperature compensation is performed by the digital temperature compensated oscillation circuit, it is possible to perform temperature compensation including the influence of the temperature characteristics of the power supply on the temperature characteristics of the oscillation frequency.

In an aspect of the present disclosure, the circuit device may include a reference current generation circuit which generates a reference current based on the reference voltage, and the oscillation signal generation circuit may include an oscillation circuit which oscillates the vibrator with a drive current based on the reference current.

According to the aspect of the present disclosure with this configuration, the reference current generation circuit is provided corresponding to the oscillation circuit. With this, since the oscillation circuit can be separated from the power supply lines of other circuits, such as the processing unit, it is possible to suppress propagation of noise through the power supply lines and to improve oscillation signal accuracy (e.g., phase noise characteristics). In the aspect of the present disclosure with the configuration described above, since temperature compensation is performed by the digital temperature compensated oscillation circuit, it is possible to perform temperature compensation including the influence of the temperature characteristics of the power supply on the temperature characteristics of the oscillation frequency.

In an aspect of the present disclosure, the reference current generation circuit may include a first transistor that is provided between a high potential-side power supply node and a first node, a second transistor that is provided between the first node and a second node, a first operational amplifier that includes a first input node, to which the reference voltage is input, a second input node connected to the second node, and an output node connected to the gate of the first transistor, and a second operational amplifier that includes a first input node, to which a predetermined voltage for setting the voltage of the first node is input, a second input node connected to the first node, and an output node connected to the gate of the second transistor.

According to the aspect of the present disclosure with this configuration, the voltage of the first node is set to the predetermined voltage through feedback control by the second operational amplifier, and the voltage of the second node is set to the reference voltage through feedback control by the first operational amplifier. In this way, the voltage of the first node and the voltage of the second node are fixed, whereby there is less influence of variation in voltage of the high potential-side power supply node, and it is possible to generate a highly stable reference current.

In an aspect of the present disclosure, the at least one reference voltage generation circuit may include: a first transistor; a second transistor that includes a gate electrode having conductivity different from that of the gate electrode of the first transistor; a first current mirror circuit that supplies a current to the first transistor and the second transistor; a first resistor that includes one end, to which a voltage corresponding to a work function difference voltage between the first transistor and the second transistor is applied; and a third transistor that is provided between a power supply node and the one end of the first resistor and in which a gate voltage is controlled based on a drain voltage of the second transistor. The at least one reference voltage generation circuit may output a voltage of the one end of the first resistor as the reference voltage.

According to the aspect of the present disclosure with this configuration, a differential pair is constituted of the first transistor and the second transistor, and the output of the differential pair is fed back to the gate of the second transistor through the third transistor. With this, it is possible to output the voltage (reference voltage) corresponding to the work function difference voltage between the first transistor and the second transistor to one end of the third transistor (one end of the first resistor).

In an aspect of the present disclosure, the power supply node may be a high potential-side power supply node.

The power supply node is a node to which a power supply voltage of a work function difference amplifier including the first to third transistors and the first resistor is supplied. According to the aspect of the present disclosure with this configuration, the power supply node is the high potential-side power supply node, whereby it is possible to constitute the reference current generation circuit of a one-stage work function difference amplifier.

In an aspect of the present disclosure, the at least one reference voltage generation circuit may further include: a fourth transistor; a fifth transistor that includes a gate electrode having conductivity different from that of the gate electrode of the fourth transistor; a second current mirror circuit that supplies a current to the fourth transistor and the fifth transistor; a second resistor that includes one end, to which a voltage corresponding to a work function difference voltage between the fourth transistor and the fifth transistor is applied; and a sixth transistor that is provided between a high potential-side power supply node and the one end of the second resistor and in which a gate voltage is controlled based on a drain voltage of the fifth transistor. The at least one reference voltage generation circuit may output a voltage of the one end of the second resistor to the power supply node.

According to the aspect of the present disclosure with this configuration, the reference voltage generated by a first work function difference amplifier including the fourth to sixth transistors and the second resistor is supplied to the power supply node of a second work function difference amplifier including the first to third transistors and the first resistor. With this, it is possible to constitute the reference current generation circuit of two-stage work function difference amplifiers.

In an aspect of the present disclosure, the at least one reference voltage generation circuit may include: a fourth transistor; a fifth transistor that includes a gate electrode having conductivity different from that of the gate electrode of the fourth transistor; a second current mirror circuit that supplies a current to the fourth transistor and the fifth transistor; and a sixth transistor that is provided between a high potential-side power supply node and the gate of the fifth transistor and in which a gate voltage is controlled based on a drain voltage of the fifth transistor. The at least one reference voltage generation circuit may output a drain voltage of the sixth transistor as a voltage corresponding to a work function difference voltage between the fourth transistor and the fifth transistor to the power supply node.

According to the aspect of the present disclosure with this configuration, the reference voltage generated by a first work function difference amplifier including the fourth to sixth transistors is supplied to the power supply node of a second work function difference amplifier including the first to third transistors and the first resistor. Even in such a configuration, it is possible to constitute the reference current generation circuit of two-stage work function difference amplifiers.

In an aspect of the present disclosure, the third transistor may be depletion type transistor.

In a case where the reference current generation circuit is constituted of two-stage work function difference amplifiers, both of the power supply voltage of the second work function difference amplifier and the output voltage become the reference voltage based on the work function difference. For this reason, a gate-source voltage of the third transistor outputting the output voltage of the second work function difference amplifier becomes extremely small. From this point, according to the aspect of the present disclosure with the configuration described above, the third transistor is a depletion type transistor, whereby it is possible to operate the third transistor.

In the aspect of the present disclosure, the at least one reference voltage generation circuit may include a capacitor that is provided between a gate node of the third transistor and a low potential-side power supply node.

The third transistor is a transistor that feeds back the output of the differential pair constituted of the first transistor and the second transistor to the gate of the second transistor. The capacitor is provided between the gate node of the third transistor and the low potential-side power supply node, whereby it is possible to improve the frequency characteristics of the PSRR.

Another aspect of the present disclosure relates to an oscillator including the circuit device described above and the vibrator.

Still another aspect of the present disclosure relates to an electronic apparatus including the circuit device described above.

In the still another aspect of the present disclosure, the electronic apparatus may further include a switching regulator which supplies the external power.

Yet another aspect of the present disclosure relates to a moving object including the circuit device described above.

BRIEF DESCRIPTION OF THE DRAWINGS

The present disclosure will be described with reference to the accompanying drawings, wherein like numbers reference like elements.

DESCRIPTION OF EXEMPLARY EMBODIMENTS

Hereinafter, a preferred embodiment of the present disclosure will be described in detail. This embodiment described below does not unduly limit the scope of the present disclosure described in the appended claims, and all configurations described in this embodiment are not necessarily essential as solving means of the present disclosure.

1. Configuration

Figure 1:
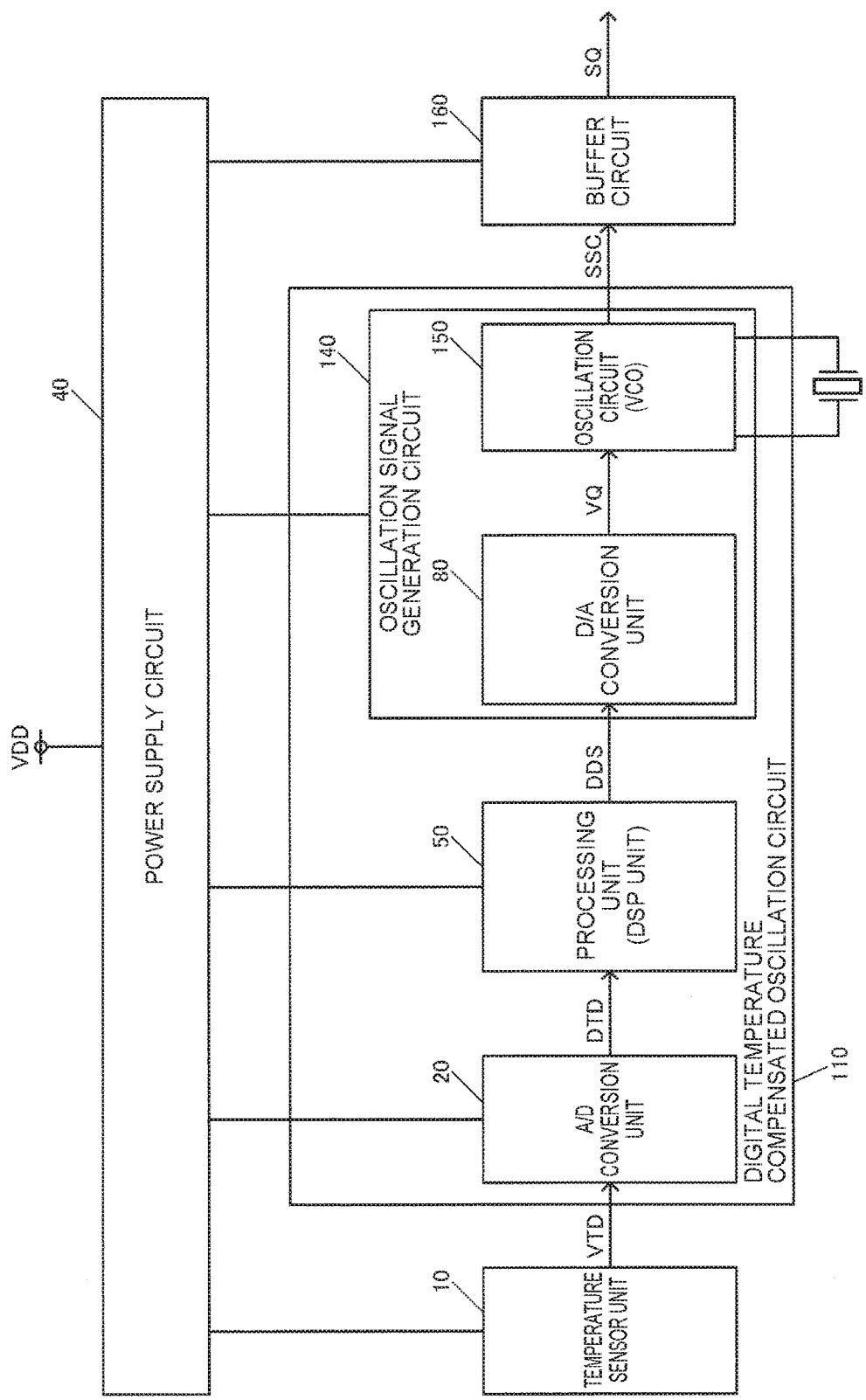
FIG. 1 shows an example configuration of a circuit device.

FIG. 1 shows an example configuration of a circuit device of this embodiment. The circuit device may be a semiconductor chip that is configured as a digital oscillator, such as a DTCXO or an oven controlled crystal oscillator (OCXO). For example, the circuit device and a vibrator XTAL are housed in a package, whereby a digital oscillator is realized.

The circuit device of FIG. 1 includes a digital temperature compensated oscillation circuit 110 and a power supply circuit 40. The digital temperature compensated oscillation circuit 110 includes an A/D conversion unit 20, a processing unit 50, and an oscillation signal generation circuit 140. The circuit device can further include a temperature sensor unit 10 and a buffer circuit 160. The configuration of the circuit device is not limited to the configuration of FIG. 1, and various modifications can be made in which some constituent elements (e.g., the temperature sensor unit, the buffer circuit, the A/D conversion unit, and the like) are omitted, other constituent elements are added, or the like.

The vibrator XTAL is, for example, a piezoelectric vibrator, such as a quartz crystal vibrator. The vibrator XTAL may be an oven type vibrator (OCXO) which is provided in a thermostatic bath. The vibrator XTAL may be a resonator (an electromechanical resonator or an electrical resonance circuit). The vibrator XTAL can be a piezoelectric vibrator, a surface acoustic wave (SAW) resonator, a micro electro mechanical systems (MEMS) vibrator, or the like. A substrate material of the vibrator XTAL can be quartz crystal, piezoelectric single crystal, such as lithium tantalate or lithium niobate, a piezoelectric material, such as piezoelectric ceramics of lead zirconate titanate or the like, a silicon semiconductor material, or the like. Excitation means of the vibrator XTAL may use a piezoelectric effect, or electrostatic driving using Coulomb force.

The temperature sensor unit 10 outputs a temperature detection voltage VTD. Specifically, the temperature detection voltage VTD is a temperature-dependent voltage that changes based on the temperature of the environment or the temperature of the circuit device. An example configuration of the temperature sensor unit 10 will be described below.

The A/D conversion unit 20 performs A/D conversion of the temperature detection voltage VTD from the temperature sensor unit 10 and outputs temperature detection data DTD. For example, digital temperature detection data DTD (A/D result data) corresponding to an A/D conversion result of the temperature detection voltage VTD is output. An A/D conversion method of the A/D conversion unit 20 can include, for example, a successive comparison method, a method similar to the successive comparison method, or the like. The A/D conversion method is not limited to these methods, and various methods (a counting type, a parallel comparison type, a serial/parallel type, or the like) can be used.

The processing unit 50, as a digital signal processing (DSP) unit, performs various kinds of signal processing. For example, the processing unit 50, as a temperature compensation unit, performs temperature compensation processing of a frequency of an oscillation signal (i.e., an oscillation frequency) based on temperature detection data DTD and outputs a frequency control data DDS of the oscillation frequency. Specifically, the processing unit 50 performs the temperature compensation processing, even if the temperature is changed, to make the oscillation frequency constant based on temperature detection data DTD (temperature-dependent data), which changes based on the temperature and coefficient data (data of coefficients of an approximate function) used for temperature compensation processing. The processing unit 50 may be realized by an ASIC circuit, such as a gate array, or may be realized by a processor (e.g., a CPU, an MPU, or the like) and a program running on the processor.

The oscillation signal generation circuit 140 generates an oscillation signal SSC. For example, the oscillation signal generation circuit 140 generates the oscillation signal SSC of an oscillation frequency set by frequency control data DDS using the frequency control data DDS from the processing unit 50 and the vibrator XTAL. As an example, the oscillation signal generation circuit 140 oscillates the vibrator XTAL with the oscillation frequency set by the frequency control data DDS to generate the oscillation signal SSC.

The oscillation signal generation circuit 140 may be a circuit which generates the oscillation signal SSC using a direct digital synthesizer system. For example, the oscillation signal SSC of the oscillation frequency set by frequency control data DDS may be generated in a digital manner with an oscillation signal of the vibrator XTAL (an oscillation source of a fixed oscillation frequency) as a reference signal.

The oscillation signal generation circuit 140 can include a D/A conversion unit 80 and an oscillation circuit 150. However, the oscillation signal generation circuit 140 is not limited to this configuration, and various modifications can be made in which some constituent elements are omitted, other constituent elements are added, or the like.

The D/A conversion unit 80 performs D/A conversion of an output of frequency control data DDS (processing unit output data) from the processing unit 50. Frequency control data DDS input to the D/A conversion unit 80 is data (i.e., frequency control code) after the temperature compensation processing by the processing unit 50. A D/A conversion method of the D/A conversion unit 80 may be, for example, a resistance string type (resistance division type) method. However, the D/A conversion method is not limited thereto, and various types, such as a resistance ladder type (R-2R ladder type), a capacitance array type, and a pulse width modulation type, can be used. The D/A conversion unit 80 can include, in addition to a D/A converter, a control circuit for D/A converter, a modulation circuit, a filter circuit, and the like.

The oscillation circuit 150 generates the oscillation signal SSC using an output voltage VQ of the D/A conversion unit 80 and the vibrator XTAL. The oscillation circuit 150 is connected to the vibrator XTAL through first and second terminals for vibrator (pads for vibrator). The oscillation circuit 150 oscillates the vibrator XTAL (piezoelectric vibrator, a resonator, or the like) to generate the oscillation signal SSC. Specifically, the oscillation circuit 150 oscillates the vibrator XTAL with the oscillation frequency with the output voltage VQ of the D/A conversion unit 80 as a frequency control voltage (oscillation control voltage). For example, in a case where the oscillation circuit 150 is a circuit (VCO) which controls the oscillation of the vibrator XTAL through voltage control, the oscillation circuit 150 can include a variable capacitance capacitor (varicap or the like) whose capacitance value changes according to the frequency control voltage.

As described above, the oscillation circuit 150 may be realized by a direct digital synthesizer system, and in this case, the oscillation frequency of the vibrator XTAL becomes a reference frequency, and becomes a frequency different from the oscillation frequency of the oscillation signal SSC.

The buffer circuit 160 performs buffering of the oscillation signal SSC generated by the oscillation circuit 150 of the oscillation signal generation circuit 140 to output a signal SQ after buffering. That is, buffering for allowing an external load to be sufficiently driven is performed. The signal SQ is, for example, a clipped sine wave signal. However, the signal SQ may be a square wave signal. Alternatively, the buffer circuit 160 may be a circuit which can output both of a clipped sine wave signal and a square wave signal as the signal SQ.

The power supply circuit 40 generates a power supply voltage to be supplied to the respective units of the circuit device based on a power supply voltage VDD supplied from the outside of the circuit device. The power supply circuit 40 includes one or a plurality of reference voltage generation circuits (work function difference amplifiers). A reference voltage generation circuit generates a reference voltage based on a work function difference between transistors, and the power supply circuit 40 supplies the reference voltage as the power supply voltage of the respective units. The power supply circuit 40 may include one reference voltage generation circuit that may supply the power supply voltage to the entire circuit device. Alternatively, the power supply circuit 40 may include a plurality of reference voltage generation circuits, and each reference voltage generation circuit may supply the power supply voltage to any one unit of the circuit device. Alternatively, in a case where the power supply circuit 40 includes a plurality of reference voltage generation circuits, there may be a reference voltage generation circuit which supplies the power supply voltage to one or more units.

The reference voltage generation circuit is, for example, an amplifier circuit in which a differential pair is constituted of a depletion type transistor and an enhancement type transistor, and outputs the difference between threshold values of the depletion type transistor and the enhancement type transistor as the reference voltage. The reference voltage generation circuit is not limited to this configuration, and a circuit in which transistors having different work functions between a gate electrode and a substrate are combined and a reference voltage is generated by the work function difference, may be used.

Figure 2:
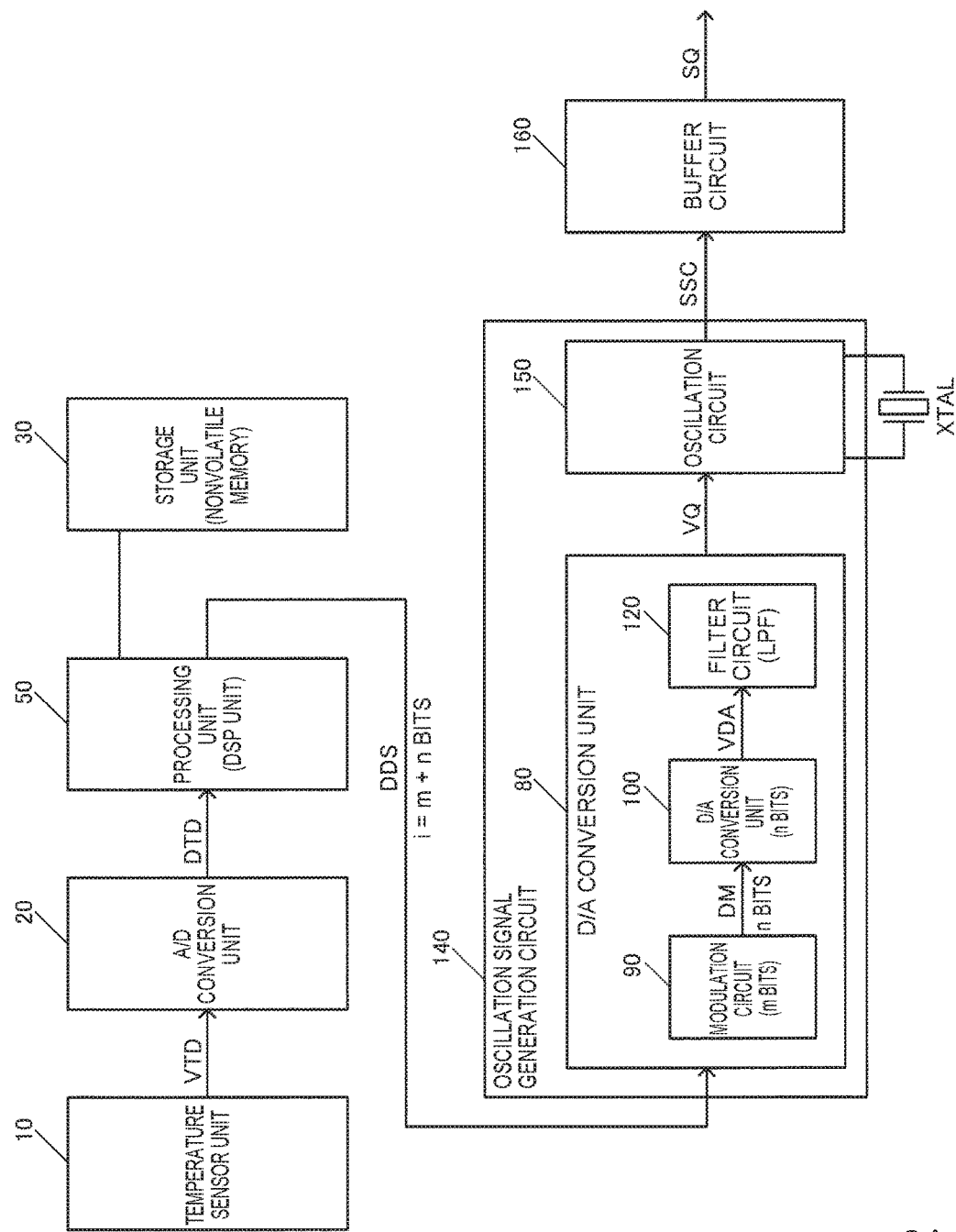
FIG. 2 shows a detailed example configuration of the circuit device.

FIG. 2 shows a detailed configuration example of the circuit device of this embodiment. In FIG. 2, the power supply circuit 40 is not shown. The circuit device of FIG. 2 includes a storage unit 30 (nonvolatile memory), the temperature sensor unit 10, the A/D conversion unit 20, the processing unit 50, the oscillation signal generation circuit 140, and the buffer circuit 160. The D/A conversion unit 80 of the oscillation signal generation circuit 140 includes a modulation circuit 90, a D/A converter 100, and a filter circuit 120.

The storage unit 30 stores a polynomial coefficient for compensating for the temperature characteristics of the oscillation frequency. For example, in a pre-shipment examination of an oscillator, the temperature characteristics of the oscillation frequency are measured by a test device. The test device determines the polynomial coefficient based on the measured temperature characteristic, and the polynomial coefficient is written to the storage unit 30 by the test device. A polynomial correlates temperature detection data DTD (output data of the A/D conversion unit 20) with frequency control data DDS (input data of the D/A conversion unit 80). The storage unit 30 is, for example, a nonvolatile memory, such as an electrically erasable programmable read-only memory (EEPROM). Alternatively, a random access memory (RAM) or a register may be used. The processing unit 50 reads the coefficient from the storage unit 30, substitutes temperature detection data DTD in the polynomial to which the coefficient is applied, generates frequency control data DDS based on an operation result of the polynomial, and outputs frequency control data DDS to the D/A conversion unit 80.

The modulation circuit 90 of the D/A conversion unit 80 receives frequency control data DDS of i=(n+m) bits from the processing unit 50 (where i, n, and m are integers equal to or greater than 1). As an example, i=20, n=16, and m=4. The modulation circuit 90 modulates n-bit (e.g., 16-bit) data of frequency control data DDS based on m-bit (e.g., 4-bit) data of frequency control data DDS. Specifically, the modulation circuit 90 performs pulse width modulation (PWM) of frequency control data DDS. A modulation method of the modulation circuit 90 is not limited to PWM, and may be, for example, pulse modulation, such as pulse density modulation (PDM), or may be a modulation method other than pulse modulation. For example, m-bit dither processing (dithering processing) may be performed on n-bit data of frequency control data DDS to realize bit extension from n bits to i bits.

The D/A converter 100 performs D/A conversion of n-bit data modulated by the modulation circuit 90. For example, D/A conversion of data of n=16 bits is performed. As a D/A conversion method of the D/A converter 100, for example, a resistance string type, a resistance ladder type, or the like can be used.

The filter circuit 120 smoothes an output voltage VDA of the D/A converter 100. For example, low-pass filter processing is performed to smooth the output voltage VDA. If the filter circuit 120 is provided, for example, pulse width demodulation of a PWM-modulated signal becomes possible. A cutoff frequency of the filter circuit 120 can be set according to the frequency of PWM of the modulation circuit 90. That is, since the signal of the output voltage VDA from the D/A converter 100 includes ripples of a fundamental frequency and harmonic components of PWM, the ripples are attenuated by the filter circuit 120. As the filter circuit 120, for example, a passive filter using a passive element, such as a resistor or a capacitor, can be used. However, as the filter circuit 120, an active filter, such as an SCF, may be used.

The resolution of the D/A conversion unit 80 is not limited to i=20 bits, and may be higher than 20 bits or may be lower than 20 bits. The number of bits of modulation of the modulation circuit 90 is not limited to m=4 bits, and may be greater (e.g., example, m=8 bits) or smaller than 4 bits.

In FIG. 2, the fact that the processing unit 50 which performs digital signal processing, such as temperature compensation processing, is provided in a pre-stage of the D/A conversion unit 80 is effectively utilized. That is, the processing unit 50 executes with a high degree of accuracy digital signal processing, such as temperature compensation processing, for example, by a floating-point operation. Accordingly, if low-order bits of an imaginary part of a result of the floating-point operation is handled as valid data and is converted to binary data, it is possible to output frequency control data DDS with a large number of bits, such as i=m+n=20 bits. In FIG. 2, frequency control data DDS of a large number of bits of i=m+n bits is supplied to the D/A conversion unit 80, and D/A conversion with high resolution of i=m+n bits is successfully realized using the m-bit modulation circuit 90 and the n-bit D/A converter 100.

In a digital oscillator, such as a DTCXO or an OCXO, extremely high frequency accuracy is required for the oscillation frequency. For example, in the TDD system, data is transmitted and received using the same frequency in an uplink and a downlink in a time-division manner, and a guard time is set between time slots allocated to respective apparatuses. For this reason, in order to realize proper communication, time synchronization needs to be performed in each apparatus, and a measurement of an accurate absolute time is required. For example, in a case where hold-over in which a reference signal (e.g., a GPS signal or a signal through the Internet) vanishes or becomes abnormal, the oscillator side needs to accurately measure the absolute time in a state where there is no reference signal. For this reason, an oscillator used in such an apparatus (e.g., GPS related apparatus, base station, or the like) requires extremely high oscillation frequency accuracy.

In order to realize this requirement, if an atomic clock is provided in each apparatus, the costs and/or size of the apparatus may increase. Even if an oscillator with high frequency accuracy is realized, it is not desirable in that a circuit device used in the oscillator increases in size, or power consumption becomes excessively large.

From this point, according to the configuration of the circuit device of FIG. 2, it is possible to realize the D/A conversion unit 80 with extremely high resolution of, for example, i≥20 bits. By providing the modulation circuit 90 or the filter circuit 120 in the D/A conversion unit 80, and with the increase in resolution, it is possible to realize improvement of the accuracy of the oscillation frequency. An increase in chip size of the circuit device or an increase in power consumption caused by providing the modulation circuit 90 or the filter circuit 120 is not so large. In addition, since the temperature compensation processing is executed by the floating-point operation in the processing unit 50, it is easy to output frequency control data DDS of, for example, i≥20 bits to the D/A conversion unit 80. Accordingly, the configuration of the circuit device of FIG. 2 has an advantage that it is possible to realize both improvement of the accuracy of the oscillation frequency and suppression of an increase in the size of the circuit device or power consumption.

The circuit device of FIGS. 1 and 2 can be used as an IC for oscillation in a PLL circuit having a phase comparison circuit which compares the reference signal (e.g., a GPS signal or a signal through the Internet) with an input signal based on the oscillation signal. In this case, the processing unit 50 may perform the temperature compensation processing, aging correction processing, or the like, for the frequency control data from the phase comparison circuit, and an oscillation signal is generated by the oscillation signal generation circuit 140.

2. Power Supply Circuit

Hereinafter, the power supply circuit 40 will be described in detail.

As described above, the circuit device of this embodiment includes the power supply circuit 40 and a digital temperature compensated oscillation circuit 110 which is operated when the power supply voltage is supplied from the power supply circuit 40. The digital temperature compensated oscillation circuit 110 includes: the A/D conversion unit 20 which performs A/D conversion of the temperature detection voltage from the temperature sensor unit 10 and outputs temperature detection data; the processing unit 50 which performs the temperature compensation processing of the oscillation frequency based on temperature detection data and outputs frequency control data of the oscillation frequency; and the oscillation signal generation circuit 140 which generates the oscillation signal of the oscillation frequency set by frequency control data using frequency control data from the processing unit 50 and the vibrator XTAL.

External power (power supply voltage VDD) is supplied to the power supply circuit 40, and the power supply circuit 40 includes at least one reference voltage generation circuit which generates the reference voltage based on the work function difference between the transistors. The power supply circuit 40 supplies the reference voltage generated by the reference voltage generation circuit as the power supply voltage.

According to this embodiment, the reference voltage is generated based on the work function difference between the transistors, and the reference voltage is supplied to the digital temperature compensated oscillation circuit 110 as the power supply voltage. With this, it is possible to realize a digital oscillator, such as a DTCXO, capable of reducing power consumption of the power supply.

A bandgap reference circuit used as a reference voltage generation circuit uses a plurality of bipolar transistors (PN junctions included in bipolar transistors) in order to cancel temperature dependence of a bandgap voltage, and has comparatively large current consumption due to a bias current flowing in these transistors. For this reason, there is a problem in that it is difficult to reduce current consumption while maintaining a high PSRR. Since the noise characteristics of the power supply affects the accuracy (e.g., phase noise characteristics) of the oscillation signal, a high PSRR is required, and from this point, there is a limit to reduction in power consumption in a power supply circuit using a bandgap reference circuit.

From this point, in this embodiment, the reference voltage is generated based on the work function difference between the transistors, whereby it is possible to maintain a high PSRR while reducing current consumption compared to a case where a bandgap reference circuit is used. For example, with reference to FIG. 6, the reference voltage can be generated by constituting a differential pair of a transistor TAc and a transistor TAd having different work functions between the gate electrode and the substrate and feeding back an output of the differential pair by a transistor TAe. In this way, in a case where the work function difference is used, since the reference voltage generation circuit can be constituted with a simple configuration, it is easy to reduce a bias current.

However, the reference voltage generated based on the work function difference between the transistors has temperature characteristics (e.g., negative temperature characteristics). In a case where such a reference voltage is supplied to the respective units of the circuit device as the power supply voltage, the temperature dependence of the power supply voltage affects the temperature characteristics of the oscillation frequency (the temperature characteristics of the oscillation frequency change compared to a case where the power supply voltage has no temperature dependence). In this embodiment, temperature compensation is performed by the digital temperature compensated oscillation circuit 110, and the digital temperature compensated oscillation circuit 110 can perform the temperature compensation of the oscillation frequency collectively including the temperature dependence of the power supply voltage. With this, the use of the reference voltage generated based on the work function difference between the transistors is made possible.

A high PSRR is obtained with low power consumption, whereby the power consumption of the power supply circuit 40 integrated in the circuit device is reduced and a highly accurate oscillation signal with less phase noise is obtained. Since a high PSRR is obtained, a switching regulator can be used as an external power supply on an upstream side. With this, it is possible to reduce the power consumption of the external power of the circuit device. As described above, the reference voltage is generated based on the work function difference between the transistors, and the reference voltage is supplied to the digital temperature compensated oscillation circuit 110 as the power supply voltage, whereby it is possible to reduce the power consumption of the power supply of the entire system including an internal power supply or the external power supply of the circuit device.

In a digital oscillator, such as a DTCXO, the temperature compensation of the oscillation frequency can be performed collectively including the temperature dependence of the power supply voltage. This will be described in detail.

Figure 3A:
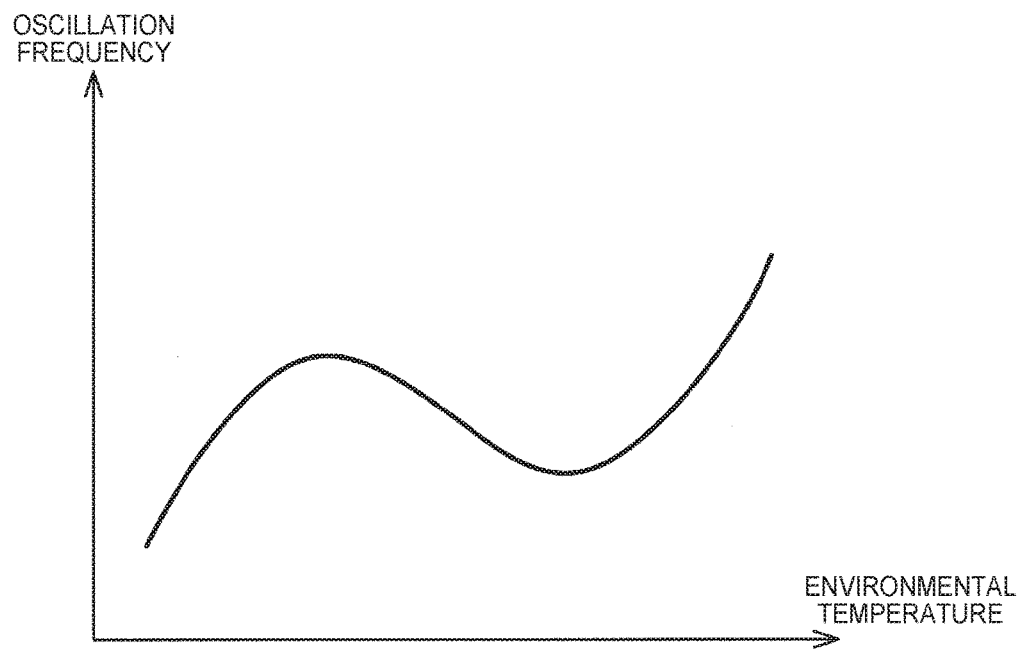
FIG. 3A shows an example of temperature dependence of an oscillation frequency.

First, as a comparative example, an analog oscillator, such as an ATCXO, is considered. The ATCXO obtains a highly accurate oscillation frequency by compensating the temperature dependence of the oscillation frequency, but the oscillation frequency before the temperature compensation has, for example, a temperature dependence shown in FIG. 3A. In the ATCXO, several environmental temperatures are set in a thermostatic bath, an oscillation frequency at each environmental temperature is measured, a coefficient of a polynomial canceling the measured temperature dependence is determined, and the coefficient is written to a nonvolatile memory or the like. For temperature compensation, the coefficient is read from the nonvolatile memory and a frequency control voltage corresponding to an output of a temperature sensor is generated, thereby compensating for the temperature dependence of the oscillation frequency.

In the temperature compensation of the ATCXO, while the relationship between the output of the temperature sensor and the frequency control voltage is determined by the polynomial, for the determination of the coefficient, the relationship to be obtained is the relationship between the environmental temperature and the oscillation frequency. For this reason, in an algorithm for coefficient determination, there are assumptions of a temperature sensor whose output is obtained and a frequency control voltage output from a function generation circuit for the output of the temperature sensor. In a case where this assumption is violated, the algorithm cannot determine an accurate coefficient. For example, while the temperature sensor detects a temperature based on the difference between a voltage without temperature dependence and a voltage with temperature dependence, if these voltages are affected by the temperature dependence of the power supply voltage, an expected sensor output (differential voltage) is not obtained for the environmental temperature. However, in the algorithm for coefficient determination, the coefficient is calculated on an assumption that the correspondence of the environmental temperature and the sensor output has characteristics as expected. For this reason, if the correspondence of the environmental temperature and the sensor output varies, accurate temperature compensation cannot be performed. For this reason, in the ATCXO, a highly stable power supply voltage without temperature dependence is required.

As an example of the temperature sensor, while a temperature sensor using a bandgap reference circuit is known, in general, the bandgap reference circuit outputs a constant voltage without depending on the power supply voltage. However, the bandgap reference circuit has a small degree of power supply voltage dependence, and in an oscillator, such as a TCXO, which requires an extremely highly accurate oscillation frequency, the small variation causes a problem.

Figure 3B:
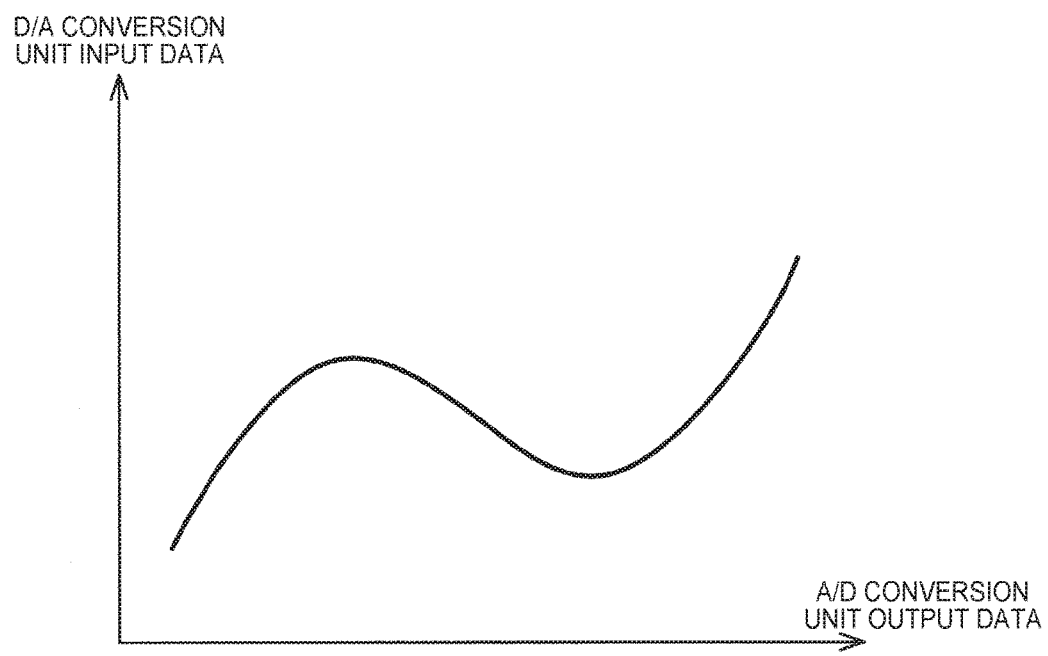
FIG. 3B shows an example of the relationship between processing unit input data and processing unit output data.

In a digital oscillator, such as a DTCXO, FIG. 3B illustrates the relationship between temperature detection data DTD (input data of the processing unit 50) and frequency control data DDS (output data of the processing unit 50). Temperature detection data DTD and frequency control data DDS may be stored in the register of the processing unit 50 and are read from the outside through a digital interface (not shown). For determining the coefficient for temperature compensation, several environmental temperatures are set in a thermostatic bath, temperature detection data DTD and frequency control data DDS at each environmental temperature are acquired, and polynomial fitting is performed to determine the coefficient of the polynomial for temperature compensation.

When performing the temperature compensation, the processing unit 50 reads the coefficient from the storage unit 30 (nonvolatile memory) and generates the frequency control data DDS (input data of the D/A conversion unit 80) corresponding to the temperature detection data DTD (output data of the A/D conversion unit 20). That is, in a digital oscillator, such as a DTCXO, the relationship between the temperature detection data DTD and the frequency control data DDS is used for the determination of the coefficient and for the temperature compensation. For this reason, the assumption of an algorithm, such as an ATCXO, is not required, and even if there is temperature dependence (e.g., variation in output of the temperature sensor due to the temperature characteristics of the power supply voltage) in a pre-stage or a post-stage of the processing unit 50, the temperature characteristics are included in the relationship between the temperature detection data DTD and the frequency control data DDS. With this, it is possible to perform temperature compensation collectively including not only the temperature characteristics of the oscillation frequency of the vibrator but also the temperature dependence of each unit of the circuit device.

In an analog oscillator, such as an ATCXO, in a case where a reference voltage based on a work function difference is used as a power supply voltage, there are problems in that variation in absolute value of the power supply voltage is large, variation in temperature gradient of the power supply voltage is large, characteristic variables of an analog temperature compensation circuit and a work function difference separately fluctuate, and the like. For this reason, a trimming step or the like for characteristic adjustment during mass production is increased, and there is a disadvantage in terms of chip size or examination costs.

In the present disclosure, in a digital oscillator, such as a DTCXO, since it is possible to perform temperature compensation collectively including all kinds of temperature dependence, it is possible to use the reference voltage based on the work function difference as the power supply voltage without causing the above-described problems. In particular, it is difficult to cope with the influence of separate fluctuations of characteristic variables of an analog temperature compensation circuit and a work function difference, and there is a large advantage in that a consideration of this point is not required.

Figure 4:
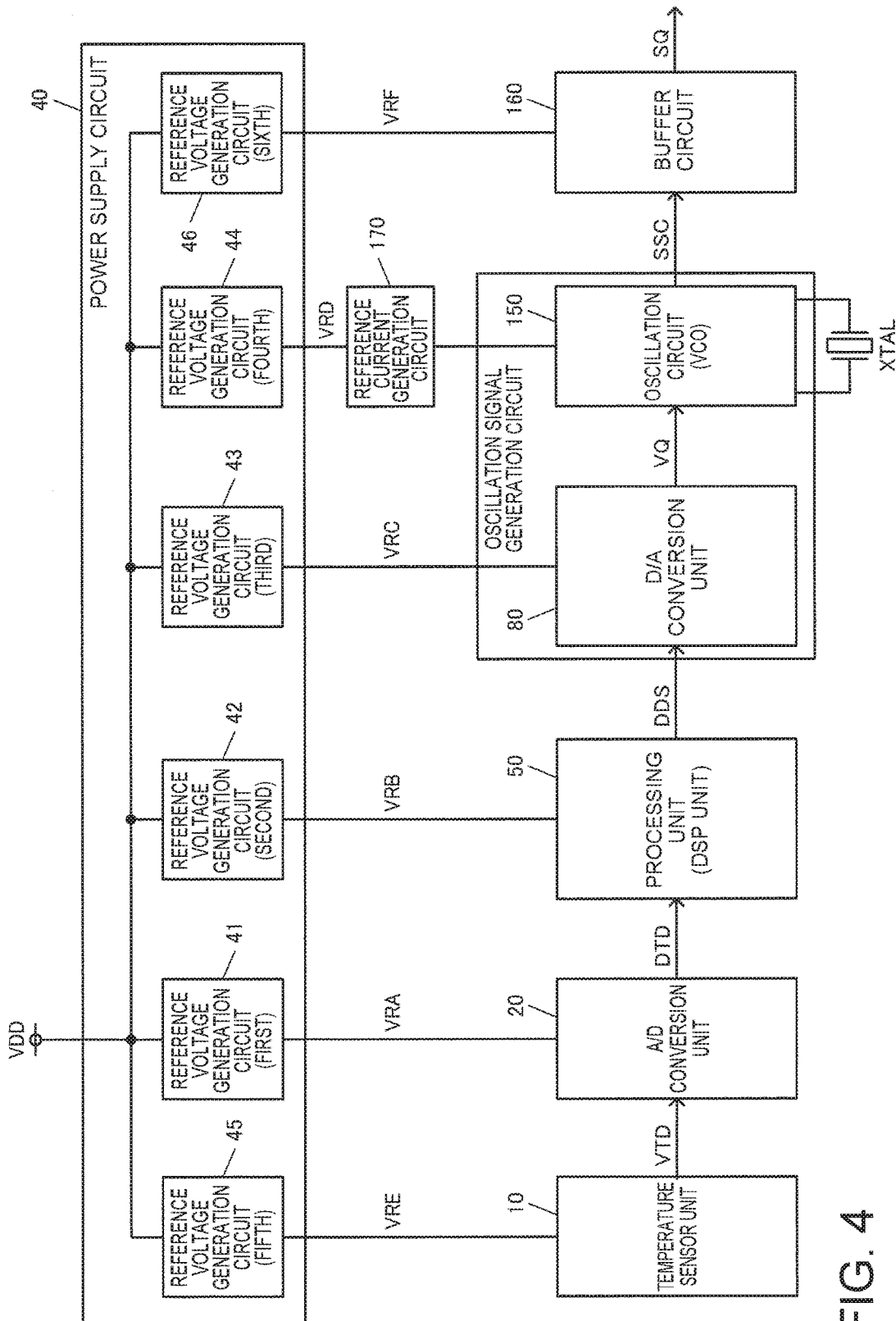
FIG. 4 shows a second detailed example configuration of the circuit device.

Hereinafter, the detailed configuration of the power supply circuit 40 will be described. FIG. 4 shows a second detailed example configuration of the circuit device. The circuit device of FIG. 4 includes a reference current generation circuit 170, the power supply circuit 40, the temperature sensor unit 10, the A/D conversion unit 20, the processing unit 50, the oscillation signal generation circuit 140, and the buffer circuit 160. In FIG. 4, the power supply circuit 40 includes first to sixth reference voltage generation circuits 41 to 46.

The first reference voltage generation circuit 41 supplies a first reference voltage generated based on the work function difference to A/D conversion unit 20 as a first power supply voltage VRA. The second reference voltage generation circuit 42 supplies a second reference voltage generated based on the work function difference to the processing unit 50 as a second power supply voltage VRB. The third reference voltage generation circuit 43 supplies a third reference voltage generated based on the work function difference to the D/A conversion unit 80 as a third power supply voltage VRC.

The power supply circuit 40 does not necessarily include all of the first reference voltage generation circuit 41, the second reference voltage generation circuit 42, and the third reference voltage generation circuit 43, and may instead include one or two of them.

In this way, the first reference voltage generation circuit 41, the second reference voltage generation circuit 42, and the third reference voltage generation circuit 43 are provided corresponding to the A/D conversion unit 20, the processing unit 50, and the D/A conversion unit 80, whereby it is possible to separate the power supply lines of the respective units. With this, it is possible to suppress propagation of noise through the power supply lines and to improve the accuracy (e.g., phase noise characteristics) of the oscillation signal.

For example, noise of a digital circuit affects the oscillation of the vibrator XTAL by the oscillation circuit 150 and causes deterioration of phase noise characteristics or the like. Since the second reference voltage generation circuit 42 is provided for the processing unit 50, it is possible to separate the power supply line of the processing unit 50 as a digital circuit from the power supply line of the oscillation circuit 150. Accordingly, it is possible to suppress propagation of noise of the digital circuit to the oscillation circuit 150. Alternatively, in a case where noise from the processing unit 50 or the oscillation circuit 150 is input to the A/D conversion unit 20 or the D/A conversion unit 80, degradation of conversion accuracy of the A/D conversion unit 20 is caused by noise to affect the accuracy of the temperature compensation, or noise of the output voltage VQ of the D/A conversion unit 80 is increased to cause deterioration of phase noise characteristics or the like. Since the first reference voltage generation circuit 41 corresponding to the A/D conversion unit 20 is provided, or the third reference voltage generation circuit 43 corresponding to the D/A conversion unit 80 is provided, it is possible to suppress propagation of noise to the A/D conversion unit 20 or the D/A conversion unit 80.

In this embodiment, while the power supply voltages VRA, VRB, and VRC are generated using the work function difference having the temperature characteristics, the influence of the temperature characteristics can be compensated collectively by digital temperature compensation processing. That is, while the temperature characteristics may be generated in the conversion result of the A/D conversion unit 20 or the D/A conversion unit 80 due to the power supply voltages VRA and VRC having the temperature characteristics, the temperature characteristics are also compensated by the digital temperature compensation processing.

Figure 6:
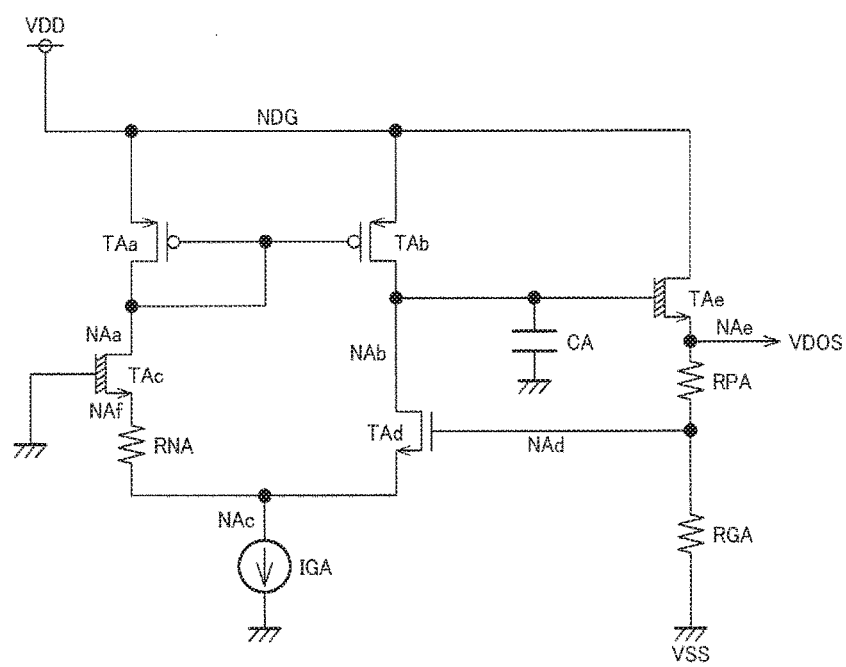
FIG. 6 shows a first detailed example configuration of a reference voltage generation circuit.
Figure 7:
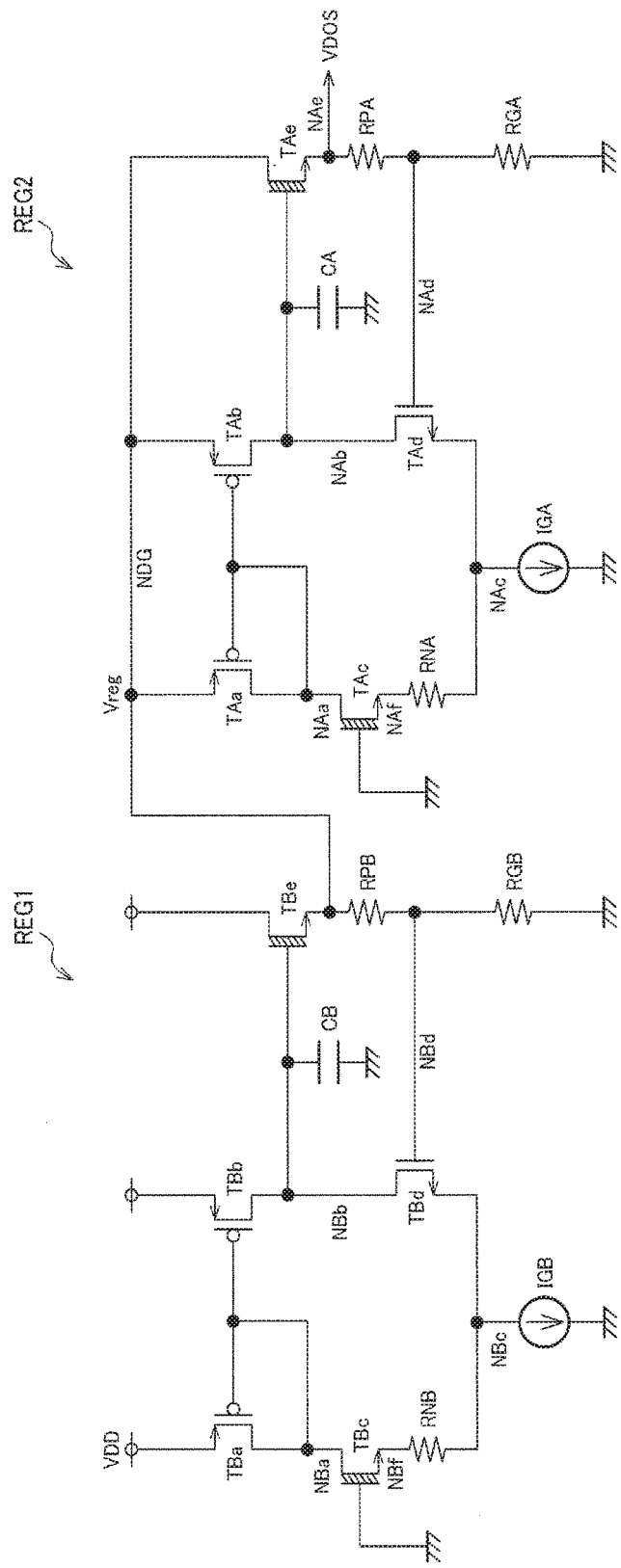
FIG. 7 shows a second detailed example configuration of the reference voltage generation circuit.
Figure 8:
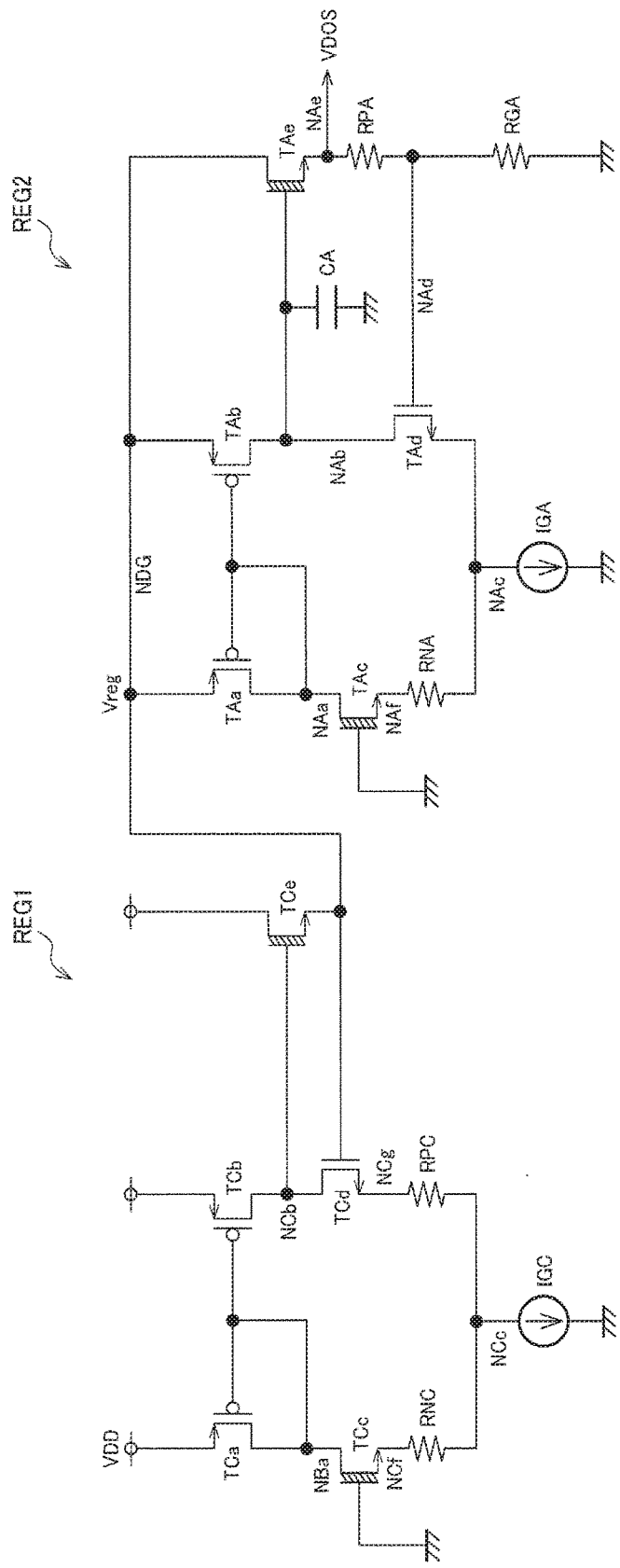
FIG. 8 shows a third detailed example configuration of the reference voltage generation circuit.

As shown in FIGS. 6 to 8, since a work function difference amplifier which generates a reference voltage based on a work function difference can be constituted of a MOS transistor or a resistor, and has a simple configuration, the work function difference amplifier has a layout area smaller than that in a bandgap reference circuit using bipolar transistors. For this reason, an increase in the layout area is suppressed even if a reference voltage generation circuit is provided in each unit, and a work function difference amplifier is suitable for a configuration for separating the power supply lines.

The reference current generation circuit 170 generates a reference current based on the reference voltage. The oscillation circuit 150 oscillates the vibrator XTAL with a drive current based on the reference current.

Specifically, the fourth reference voltage generation circuit 44 generates a reference voltage based on the work function difference and outputs the reference voltage to the reference current generation circuit 170 as a fourth power supply voltage VRD. As described below referring to FIG. 10, the reference current generation circuit 170 generates a reference current IRD based on the reference voltage (power supply voltage VRD) and outputs bias voltages QD1 and QD2 corresponding to the reference current IRD to the oscillation circuit 150, the oscillation circuit 150 converts the bias voltages QD1 and QD2 to a drive current IBX using the transistors TDd and TDe, and a bipolar transistor TRX to which the drive current IBX is supplied drives the vibrator XTAL.

In this way, the reference current generation circuit 170 corresponding to the oscillation circuit 150 is provided, whereby it is possible to separate the oscillation circuit 150 from the power supply lines of other circuits, such as the processing unit 50. With this, it is possible to suppress propagation of noise through the power supply lines and to improve the accuracy (e.g., phase noise characteristics) of the oscillation signal. In this embodiment, while the reference voltage is generated using the work function difference having the temperature characteristics, the influence of the temperature characteristics can be compensated collectively by the digital temperature compensation processing. That is, while the temperature characteristics may be generated in the oscillation frequency characteristics of the oscillation circuit 150 due to the reference voltage having the temperature characteristics, the temperature characteristics are also compensated by the digital temperature compensation processing.

The fifth reference voltage generation circuit 45 supplies a fifth reference voltage generated based on the work function difference to the temperature sensor unit 10 as a fifth power supply voltage VRE. The sixth reference voltage generation circuit 46 supplies a sixth reference voltage generated based on the work function difference to the buffer circuit 160 as a sixth power supply voltage VRF.

In this way, it is possible to separate the power supply line of the temperature sensor unit 10 or the buffer circuit 160 and to suppress propagation of noise through the power supply lines. Even if the temperature characteristics of the reference voltage affect the sensor characteristics of the temperature sensor unit 10 or the like, the influence of the temperature characteristics can be compensated collectively by the digital temperature compensation processing.

Figure 5:
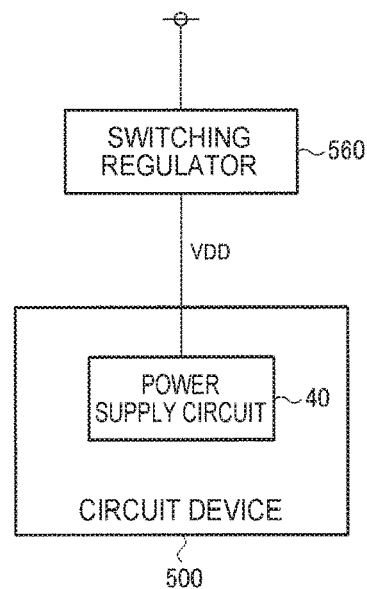
FIG. 5 shows an example configuration of an electronic apparatus.

FIG. 5 shows an example configuration of an electronic apparatus including the circuit device of this embodiment. As described below referring to FIG. 16B, while the electronic apparatus can include constituent elements, such as a processing unit 520, these constituent elements are not shown.

The electronic apparatus of FIG. 5 includes a switching regulator 560 (external power supply circuit) and a circuit device 500. The circuit device 500 includes the power supply circuit 40, and external power (power supply voltage VDD) is supplied to the power supply circuit 40 from the switching regulator 560.

The switching regulator 560 is constituted of, for example, a switch element, such as a transistor, an inductor, a capacitor, a diode, and the like. In an ON period during which the switch element is switched on, the power supply and one end of the inductor are connected through the switch element, the inductor is driven, and the electric charge is supplied to the capacitor. In an OFF period in which the switch element is switched off, the power supply and one end of the inductor are shut off, energy stored in the inductor is discharged, and electric charge passing through the diode is supplied to the capacitor. An output voltage of the switching regulator 560 is fed back, whereby the duty of the ON period and the OFF period is suppressed and the output voltage is maintained constant.

The configuration of the switching regulator 560 is not limited thereto, and a DC-DC convertor which connects or shuts off a power supply intermittently by switching on/off the switch element (performs chopping) may be used.

Since the switching regulator 560 has almost no electric power loss by a resistor unlike a linear regulator, power consumption is reduced compared to the linear regulator. Since chopping is performed by the switch element, noise of external power (power supply voltage VDD) is larger than in the linear regulator. From this point, according to this embodiment, the reference voltage is generated based on the work function difference, whereby it is possible to realize a high PSRR while suppressing the power consumption of the power supply circuit 40, and to reduce power consumption as the entire power supply system including the switching regulator 560 and the power supply circuit 40.

3. Reference Voltage Generation Circuit

FIG. 6 shows a first detailed example configuration of a reference voltage generation circuit. The reference voltage generation circuit of FIG. 6 can be applied to any one of the first to sixth reference voltage generation circuits 41 to 46. The reference voltage generation circuit of FIG. 6 includes transistors TAa, TAb, TAc, TAd, and TAe, resistors RNA, RPA, and RGA (resistive elements), a capacitor CA, and a current source IGA.

The transistor TAa and the transistor TAb constitute a current mirror circuit, and supply a current to the transistor TAc and a transistor TAd. The transistor TAc and the transistor TAd constitute a differential pair. The current source IGA supplies a bias current to the differential pair. The transistors TAa and TAb are, for example, P-type transistors (in a broad sense, first conduction type transistors), and the transistors TAc and TAd are N-type transistors (in a broad sense, second conduction type transistors). The transistors TAa, TAb, and TAd are enhancement type transistors, and the transistor TAc is a depletion type transistor.

The transistors TAa and TAb are provided between a node NDG for power supply and nodes NAa and NAb. In the configuration example of FIG. 6, the node NDG for power supply is a high potential-side power supply node (a node of a power supply voltage VDD). A voltage (power supply voltage VDD) of the node NDG for power supply is supplied to the sources of the transistors TAa and TAb, and the gate electrodes of the transistors TAa and TAb are connected to a node NAa of the drain of the transistor TAa.

The transistors TAc and TAd are provided between the nodes NAa and NAb and nodes NAf and NAc. The resistor RNA is provided between the node NAf and the node NAc. A power supply voltage VSS (low potential-side power supply voltage) is input to the gate electrode of the transistor TAc. The gate electrode of the transistor TAd is connected to the node NAd. The current source IGA is provided in series between the node NAc and a node of the power supply voltage VSS.

The transistor TAe) is a depletion N-type transistor. The transistor TAe is provided between the node NDG (high potential-side power supply node) for power supply and an output node NAe (one end of the resistor RPA), and the output node NAb of the differential pair is connected to the gate electrode of the transistor TAe. That is, the transistor TAe is configured such that a gate voltage thereof is controlled based on a drain voltage of the transistor TAd. The capacitor CA is provided between the node NAb and the node (low-potential side power supply node) of the power supply voltage VSS. The resistor RPA (first resistor) is provided between the output node NAe and the node NAd (the gate node of the transistor TAd) and outputs a voltage VDOS on one end (node NAe) as a reference voltage. The resistor RGA is provided between the node NAd and the node of the power supply voltage VSS.

The transistor TAd is a transistor which includes a gate electrode having conductivity different from that of the gate electrode of the transistor TAc. For example, the gate electrode of the transistor TAc is an N type, and the gate electrode of the transistor TAd is a P type. For example, the transistors TAc and TAd have the same substrate impurity concentration or the same channel impurity concentration, but are different in the conductivity of the gate electrode and are different in the impurity concentration of the gate electrode.

Specifically, a threshold voltage of a MOS transistor can be represented by $Vth=\phi_{MS}-Q_{SS}/C_{OX}+2\phi_F+Q_D/C_{OX}$. Here, $\phi_{MS}$ is a work function difference of a gate electrode and a substrate, $Q_{SS}$ is fixed electric charge in an oxide film, $C_{OX}$ is capacitance per unit area of a gate oxide film, $\phi_F$ is a Fermi level, and $Q_D$ is electric charge in a depletion layer. With the settings of the impurity concentration of the N-type gate electrode of the transistor TAc and the impurity concentration of the P-type gate electrode of the transistor TAd, a threshold voltage VTN of the depletion type transistor TAc is set to, for example, −0.52 V, and a threshold voltage VTP of the enhancement type transistor TAd is set to, for example, 0.45 V. Accordingly, a reference voltage VDOS (power supply voltage) of VTP−VTN=0.97 V is output to the output node NAe of the reference voltage generation circuit. That is, even in a case where the power supply voltage VDD varies, a constant reference voltage VDOS can be supplied.

FIG. 7 shows a second detailed example configuration of a reference voltage generation circuit. The reference voltage generation circuit of FIG. 7 can be applied to any one of the first to sixth reference voltage generation circuits 41 to 46. The reference voltage generation circuit of FIG. 7 includes a first work function difference amplifier REG1, and a second work function difference amplifier REG2. The first work function difference amplifier REG1 includes transistors TBa, TBb, TBc, TBd, and TBe, resistors RNB, RPB, and RGB (resistive elements), a capacitor CB, and a current source IGB. The second work function difference amplifier REG2 includes transistors TAa, TAb, TAc, TAd, and TAe, resistors RNA, RPA, and RGA, a capacitor CA, and a current source IGA.

While the configuration of the second work function difference amplifier REG2 is the same as the configuration of the reference voltage generation circuit of FIG. 6, in FIG. 7, an output voltage Vreg of the first work function difference amplifier REG1 is input to the node NDG for power supply.

The configuration of the first work function difference amplifier REG1 will be described.

The transistor TBa and the transistor TBb constitute a current mirror circuit, and supply a current to the transistor TBc and the transistor TBd. The transistor TBc and the transistor TBd constitute a differential pair. The current source IGB supplies a bias current to the differential pair. The transistors TBa and TBb are, for example, P-type transistors, and the transistors TBc and TBd are N-type transistors. The transistors TBa, TBb, and TBd are enhancement type transistors, and the transistor TBc is a depletion type transistor.

The transistors TBa and TBb are provided between the high potential-side power supply node (the node of the power supply voltage VDD) and nodes NBa and NBb. The power supply voltage VDD is supplied to the sources of the transistors TBa and TBb, and the gate electrodes of the transistors TBa and TBb are connected to a node NBa of the drain of the transistor TBa.

The transistors TBc and TBd are provided between the nodes NBa and NBb and nodes NBf and NBc. The resistor RNB is provided between the node NBf and the node NBc. The power supply voltage VSS is input to the gate electrode of the transistor TBc. The gate electrode of the transistor TBd is connected to a node NBd. The current source IGB is provided in series between the node NBc and a node of the power supply voltage VSS.

The transistor TBe is a depletion N-type transistor. The transistor TBe is provided between the high potential-side power supply node and the output node NBe (one end of the resistor RPB), and the output node NBb of the differential pair is connected to the gate electrode of the transistor TBe. That is, the transistor TBe is configured such that a gate voltage thereof is controlled based on a drain voltage of the transistor TBd. The capacitor CB is provided between the node NBb and the node of the power supply voltage VSS. The resistor RPB (second resistor) is provided between the output node NBe and the node NBd (the gate node of the transistor TBd), and a voltage Vreg corresponding to a work function difference voltage between the transistors TBc and TBd is applied to one end of the resistor RPB. The resistor RPB outputs the voltage Vreg on one end to the node NDG for power supply of the first work function difference amplifier REG1. The resistor RGB is provided between the node NBd and the node of the power supply voltage VSS.

The transistor TBd is a transistor which includes a gate electrode having conductivity different from that of the gate electrode of the transistor TBc. For example, the gate electrode of the transistor TBc is an N type, and the gate electrode of the transistor TBd is a P type. For example, the transistors TBc and TBd have the same substrate impurity concentration or the same channel impurity concentration, but are different in the conductivity of the gate electrode and are different in the impurity concentration of the gate electrode.

FIG. 8 shows a third detailed example configuration of a reference voltage generation circuit. The reference voltage generation circuit of FIG. 8 can be applied to any one of the first to sixth reference voltage generation circuits 41 to 46. The reference voltage generation circuit of FIG. 8 includes a first work function difference amplifier REG1 and a second work function difference amplifier REG2. The first work function difference amplifier REG1 includes transistors TCa, TCb, TCc, TCd, and TCe, resistors RNC and RPC (resistive elements), and a current source IGC. The second work function difference amplifier REG2 includes transistors TAa, TAb, TAc, TAd, and TAe, resistors RNA, RPA, and RGA, a capacitor CA, and a current source IGA.

While the configuration of the second work function difference amplifier REG2 is the same as the configuration of the reference voltage generation circuit of FIG. 6, in FIG. 8, an output voltage Vreg of the first work function difference amplifier REG1 is input to the node NDG for power supply.

The configuration of the first work function difference amplifier REG1 will be described.

The transistor TCa and the transistor TCb constitute a current mirror circuit, and supply a current to the transistor TCc and the transistor TCd. (The transistor TCc and the transistor TCd constitute a differential pair. The current source IGC supplies a bias current to the differential pair. The transistors TCa and TCb are, for example, P-type transistors, and the transistors TCc and TCd are N-type transistors. The transistors TCa, TCb, and TCd are enhancement type transistors, and the transistor TCc is a depletion type transistor.

The transistors TCa and TCb are provided between the high potential-side power supply node (the node of the power supply voltage VDD) and nodes NCa and NCb. The power supply voltage VDD is supplied to the sources of the transistors TCa and TCb, and the gate electrodes of the transistors TCa and TCb are connected to a node NCa of the drain of the transistor TCa.

The transistors TCc and TCd are provided between the nodes NCa and NCb and nodes NCf and NCg. The resistors RNC and RPC are provided between the nodes NCf and NGg and a node NBc. The power supply voltage VSS is input to the gate electrode of the transistor TCc. The gate electrode of the transistor TCd is connected to the drain (the node NDG for power supply) of the transistor TCe. The current source IGC is provided in series between a node NCc and the node of the power supply voltage VSS.

The transistor TCe is a depletion N-type transistor. The transistor TCe is provided between the high potential-side power supply node and the gate node (the node NDG for power supply) of the transistor TCd. That is, the transistor TCe is configured such that a gate voltage thereof is controlled based on a drain voltage of the transistor TCd. The drain voltage of the transistor TCd is a voltage Vreg corresponding to a work function difference voltage between the transistors TCc and TCd, and the voltage Vreg is output to the node NDG for power supply.

The transistor TCd is a transistor which includes a gate electrode having conductivity different from that of the gate electrode of the transistor TCc. For example, the gate electrode of the transistor TCc is an N type, and the gate electrode of the transistor TCd is a P type. For example, the transistors TCc and TCd have the same substrate impurity concentration or the same channel impurity concentration, but are different in the conductivity of the gate electrode and are different in the impurity concentration of the gate electrode.

Figure 9:
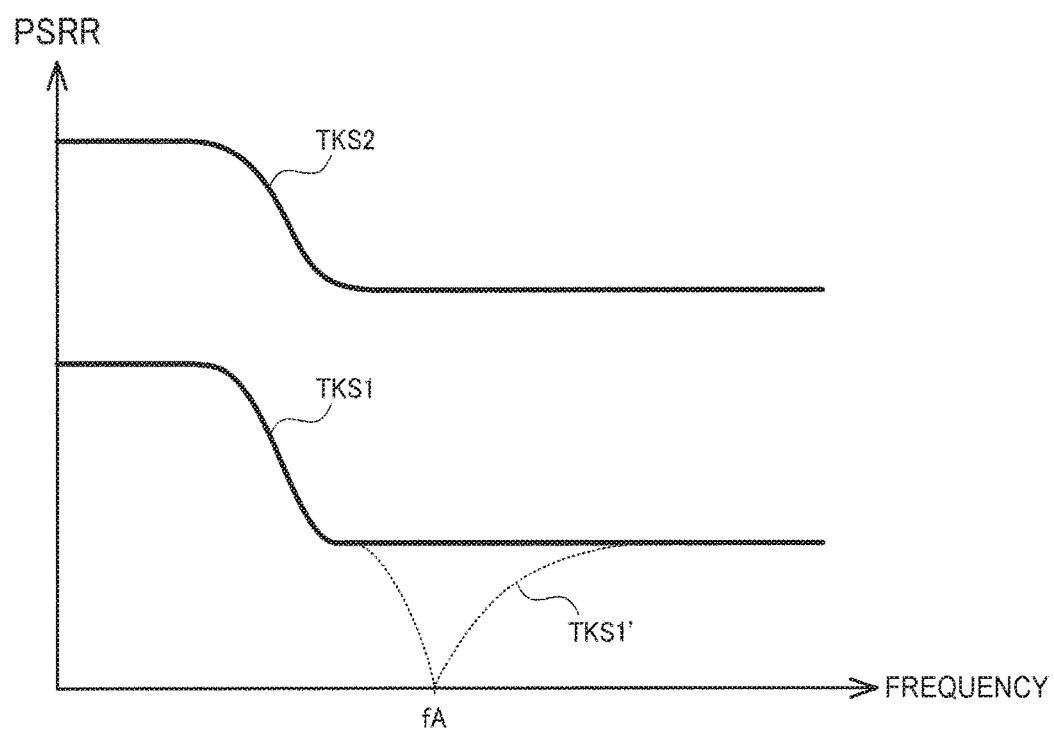
FIG. 9 is a schematic view of frequency characteristics of a PSRR of the reference voltage generation circuit.

As in FIGS. 7 and 8, the first work function difference amplifier REG1 and the second work function difference amplifier REG2 are connected in series, whereby it is possible to further improve a PSRR than the one-stage work function difference amplifier shown in FIG. 6. FIG. 9 is a graph of frequency characteristics of the PSRR of the reference voltage generation circuit. In FIG. 9, both of the vertical axis and the horizontal axis are logarithmic axes (the PSRR is, for example, in terms of decibels). TKS1 represents the frequency characteristics of the PSRR of the one-stage work function difference amplifier, and TKS2 represents the frequency characteristics of the PSRR of the two-stage work function difference amplifier. As shown in TKS2, in a case of the two-stage work function difference amplifier, since the PSRR of each stage is added, the PSRR which is about two times larger than that in the one-stage work function difference amplifier is obtained.

In FIGS. 7 and 8, the transistor TAe is a depletion type transistor.

In the two-stage work function difference amplifier, for example, the first work function difference amplifier REG1 outputs the voltage Vreg=0.97 V, and the second work function difference amplifier REG2 outputs the voltage VDOS=0.9 V with the voltage Vreg=0.97 V as a power supply. Since the transistor TAe is an N-type transistor, and the source thereof is at the voltage VDOS=0.9 V, only an extremely small gate-source voltage can be taken, switching-on cannot be performed in an enhancement type transistor. From this point, in this embodiment, since the transistor TAe is a depletion type transistor, switching-on can be performed even in an N-type transistor.

In FIGS. 6 to 8, the transistors TAe, TBe, and TCe in the output stage of the work function difference amplifier are N-type transistors. With this, it is possible to expect improvement of the PSRR compared to a case where P-type transistors are used. For example, the transistor TAe of FIG. 6 will be described as an example. In a case where a P-type transistor is used for the transistor TAe, the source of the P-type transistor is at the power supply voltage VDD. For this reason, while the gate-source voltage is affected by noise of the power supply voltage VDD, the PSRR is maintained by the gain of the amplifier within the bandwidth of the amplifier. However, in the high frequency band other than the bandwidth of the amplifier, the PSRR is lowered by the influence of noise of the power supply voltage VDD. An N-type transistor is used for the transistor TAe, whereby the source of the transistor TAe is at the output voltage VDOS and the gate-source voltage is hardly affected by noise of the power supply voltage VDD. However, switching-on is hardly performed as described above, and thus, a depletion type transistor is used, thereby solving this problem.

In FIGS. 6 to 8, the capacitor CA is provided between the gate node NAb of the transistor TAe and the low potential-side power supply node. In FIG. 7, the capacitor CB is provided between the gate node NBb of the transistor TBe and a low potential-side power supply node.

With this, it is possible to further improve the PSRR in the high frequency band. TKS1' of FIG. 9 represents the frequency characteristics of the PSRR of the work function difference amplifier in a case where the capacitor CA (CB) is not provided, and TKS1 represents the frequency characteristics of the PSRR of the work function difference amplifier in a case where the capacitor CA (CB) is provided. In the low frequency region and the high frequency region, the frequency characteristics TKS1' in a case where the capacitor CA is not provided are the same as the frequency characteristic TKS1 in a case where the capacitor CA is provided. In the low frequency region, the PSRR which is substantially the same as the DC gain of the amplifier is obtained, and in the high frequency region, the PSRR is determined by the ratio of the capacitance of the capacitor CA and the parasitic capacitance between the source and the drain of the transistor TAe. In the frequency characteristic TKS1' in a case where the capacitor CA is not provided, there is a frequency fA at which the PSRR is extremely lowered (becomes zero) between the low frequency region and the high frequency region. In the vicinity of the frequency fA, since noise of the power supply propagates to the reference voltage, this causes deterioration of phase noise characteristics.

From this point, in this embodiment, the capacitor CA (CB) is provided, whereby it is possible to improve the PSRR in the vicinity of the frequency fA. With this, it is possible to obtain a high PSRR over a wide bandwidth and to improve phase noise characteristics.

4. Reference Current Generation Circuit, Oscillation Circuit

Figure 10:
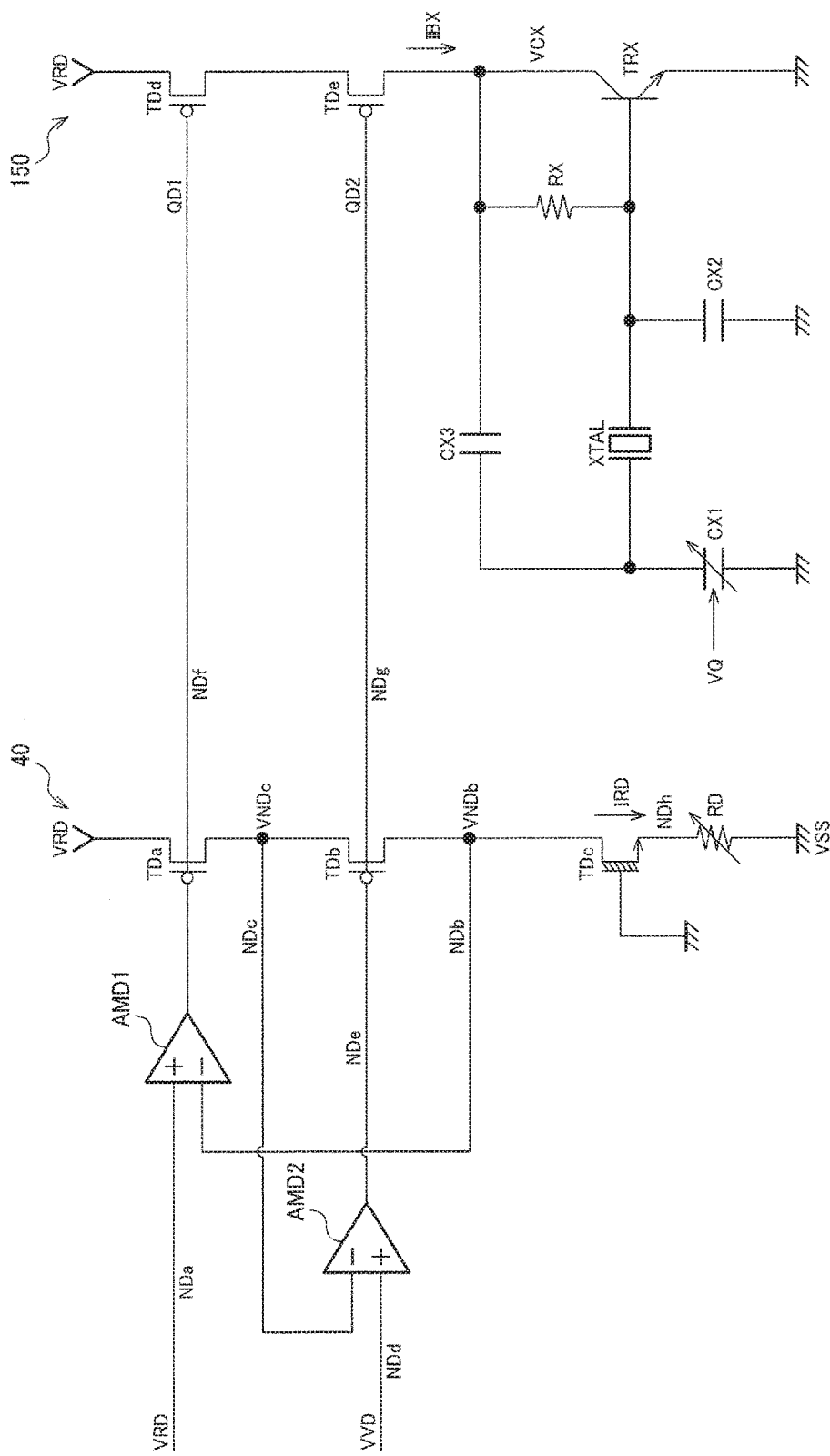
FIG. 10 shows a detailed configuration example of a reference current generation circuit and an oscillation circuit.

FIG. 10 shows a detailed example configuration of the reference current generation circuit 170 and the oscillation circuit 150.

The reference current generation circuit 170 includes transistors TDa, TDb, and TDc, operational amplifiers AMD1 and AMD2, and a resistor RD.

The transistor TDa is provided between a high potential-side power supply node (a node of a power supply voltage VRD) and a first node NDc. The transistor TDb is provided between the first node NDc and a second node NDb. The transistors TDa and TDb are, for example, enhancement P-type transistors.

The power supply voltage VRD is input to a first input node NDa (positive polarity input node, non-inverting input node) of the operational amplifier AMD1 (first operational amplifier), a second input node (negative polarity input node, inverting input node) of the operational amplifier AMD1 is connected to the second node NDb, and an output node NDf of the operational amplifier AMD1 is connected to the gate of the transistor TDa.

A predetermined voltage VVD for setting a voltage VNDc of the first node NDc is input to a first input node NDd (positive polarity input node, non-inverting input node) of the operational amplifier AMD2 (second operational amplifier), a second input node (negative polarity input node, inverting input node) of the operational amplifier AMD2 is connected to the first node NDc, and an output node NDg of the operational amplifier AMD2 is connected to the gate of the transistor TDb.

The transistor TDc is provided between the node NDb and a node NDh, and the power supply voltage VSS is input to the gate of the transistor TDc. The transistor TDc is, for example, a depletion N-type transistor. The resistor RD is provided between the node NDh and the low potential-side power supply node. The resistor RD is a variable resistor, and can be constituted of a ladder resistor whose resistance value can be controlled in a variable manner by selecting a tap using a switch, or the like. The transistor TDc and the resistor RD are a current source which supplies a bias current to the transistors TDa and TDb. The reference current IRD can be adjusted by adjusting the resistance value of the resistor RD.

The predetermined voltage VVD is set to, for example, VVD=VRD−0.2 V, and the voltage of the first node NDc becomes VNDc=VVD=VRD−0.2 V through feedback control of the operational amplifier AMD2. The voltage of the second node NDb becomes VNDb=VRD through feedback control of the operational amplifier AMD1. In this way, the voltage VNDc of the first node NDc and the voltage VNDb of the second node NDb are fixed, whereby the voltage VNDc of the first node NDc and the voltage VNDb of the second node NDb are hardly affected by variation in high potential-side power supply (power supply voltage VRD), and a highly stable reference current IRD can be generated.

The oscillation circuit 150 includes transistors TDd and TDe, a bipolar transistor TRX, a resistor RX, a variable capacitance capacitor CX1, and capacitors CX2 and CX3.

The gate voltages (bias voltages QD1 and QD2) of the transistors TDa and TDb of the reference current generation circuit 170 are input to the transistors TDd and TDe. That is, the transistors TDd and TDe perform mirroring of the reference current IRD at a predetermined ratio and supply a drive current IBX (bias current) to the collector of the bipolar transistor TRX. The resistor RX is provided between the collector and the base of the bipolar transistor TRX.

One end of the variable capacitance capacitor CX1 whose capacitance is variable is connected to one end of the vibrator XTAL. Specifically, one end of the variable capacitance capacitor CX1 is connected to one end of the vibrator XTAL through a terminal for first vibrator (pad for vibrator) of the circuit device. One end of the capacitor CX2 is connected to the other end of the vibrator XTAL. Specifically, one end of the capacitor CX2 is connected to the other end of the vibrator XTAL through a terminal for second vibrator (pad for vibrator) of the circuit device. The capacitor CX3 includes one end connected to one end of the vibrator XTAL and the other end connected to the collector of the bipolar transistor TRX.

A base-emitter current generated by oscillation of the vibrator XTAL flows in the bipolar transistor TRX. If the base-emitter current increases, since a collector-emitter current of the bipolar transistor TRX increases, and a bias current branching to the resistor RX out of the drive current IBX decreases, a collector voltage VCX is lowered. If the base-emitter current of the bipolar transistor TRX decreases, since the collector-emitter current decreases, and a bias current branching to the resistor RX out of the drive current IBX increases, the collector voltage VCX is raised. The collector voltage VCX is fed back to the vibrator XTAL through the capacitor CX3.

The oscillation frequency of the vibrator XTAL includes the temperature characteristic (e.g., the temperature characteristics of FIGS. 3A and 3B), and the temperature characteristics are compensated by the output voltage VQ (frequency control voltage) of the D/A conversion unit 80. That is, the output voltage VQ is input to the variable capacitance capacitor CX1, and the capacitance value of the variable capacitance capacitor CX1 is controlled by the output voltage VQ. If the capacitance value of the variable capacitance capacitor CX1 changes, since a resonance frequency of a resonance loop changes, variation in oscillation frequency due to the temperature characteristics of the vibrator XTAL is compensated. The variable capacitance capacitor CX1 is realized by, for example, a variable capacitance diode (varactor) or the like.

The oscillation circuit 150 of this embodiment is not limited to the configuration of FIG. 10, and various modifications can be made. For example, in FIG. 10, although a case where CX1 is a variable capacitance capacitor has been described as an example, CX2 or CX3 may be a variable capacitance capacitor which is controlled by the output voltage VQ. A plurality of capacitors among CX1 to CX3 may be variable capacitance capacitors which are controlled by VQ.

5. D/A Conversion Unit

Figure 11:
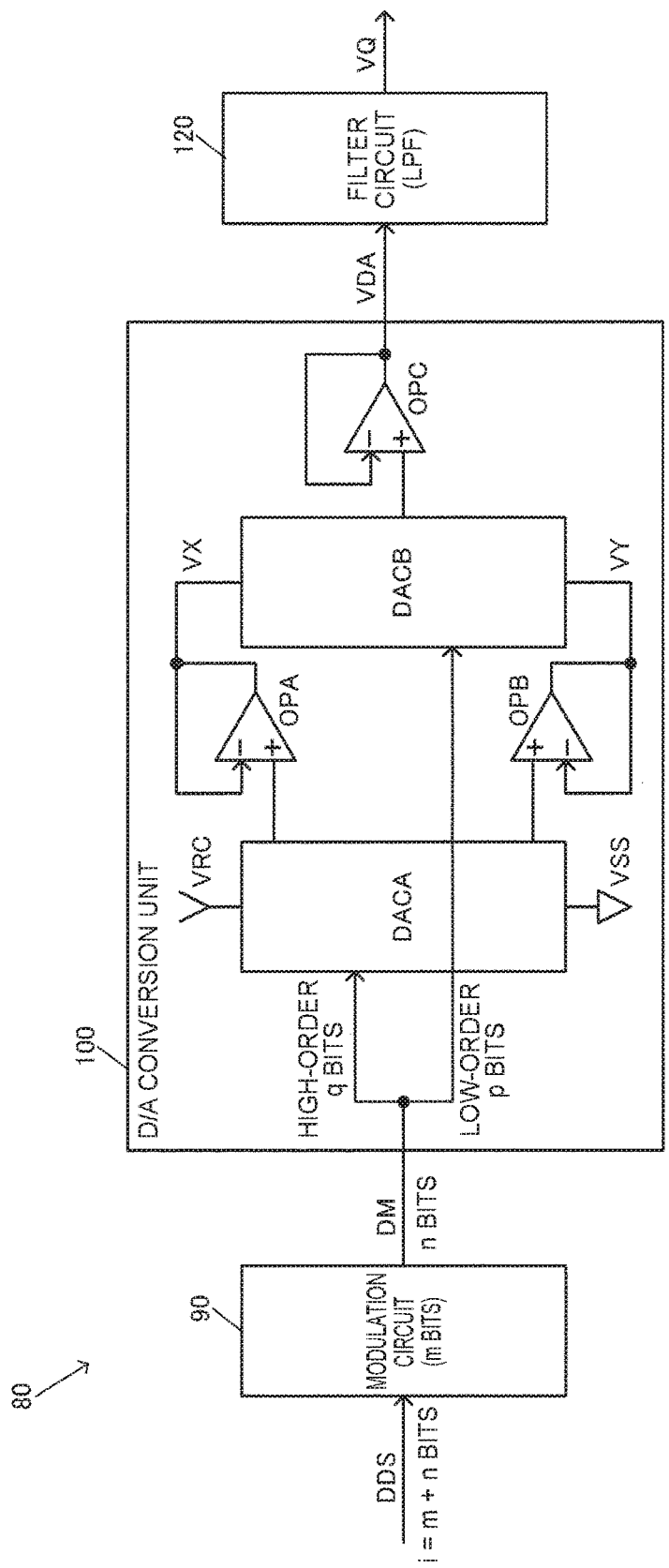
FIG. 11 shows a detailed example configuration of a D/A conversion unit.

FIG. 11 shows a detailed example configuration of the D/A conversion unit 80. The D/A conversion unit 80 includes a modulation circuit 90, a D/A converter 100, and a filter circuit 120.

The D/A converter 100 includes a high-order D/A converter DACA, a low-order D/A converter DACB, and operational amplifiers OPA, OPB, and OPC connected in a voltage follower manner.

High-order q-bit data of n-bit (n=q+p) data DM from the modulation circuit 90 is input to the high-order D/A converter DACA, and low-order p-bit (e.g., example, p=q=8) data is input to the low-order D/A converter DACB. The high-order D/A converter DACA and the low-order D/A converter DACB are, for example, resistance string type D/A converters which select a voltage corresponding to input data from among a plurality of divided voltages that are divided by a plurality of resistors connected in series.

The high-order D/A converter DACA includes a plurality of resistors connected in series between a node of the power supply voltage VRC (reference voltage) and the node of the voltage VSS. The high-order D/A converter DACA outputs one divided voltage of the divided voltages at both ends of a resistor specified by high-order q-bit data among a plurality of resistors to the non-inverting input terminal of the operational amplifier OPA and outputs the other divided voltage to the non-inverting input terminal of the operational amplifier OPB. With this, one voltage is impedance-converted by the operational amplifier OPA connected in a voltage follower manner and is supplied to the low-order D/A converter DACB as a voltage VX. The other voltage is impedance-converted by the operational amplifier OPB connected in a voltage follower manner and is supplied to the low-order D/A converter DACB as a voltage VY.

The low-order D/A converter DACB includes a plurality of resistors connected in series between a node of the voltage VX and a node of the voltage VY. The low-order D/A converter DACB outputs one divided voltage selected by low-order p-bit data among the plurality of divided voltages by the plurality of resistors to the non-inverting input terminal of the operational amplifier OPC connected in a voltage follower manner as a selected voltage. With this, the selected voltage is output as an output voltage VDA of the D/A converter 100.

6. Temperature Sensor Unit, Oscillation Circuit

Figure 12A:
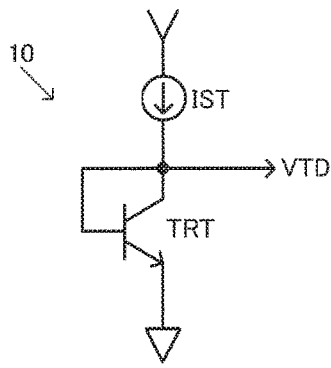
FIG. 12A shows a first example configuration of a temperature sensor unit.

FIG. 12A shows a first example configuration of the temperature sensor unit 10. The temperature sensor unit 10 of FIG. 12A includes a current source IST and a bipolar transistor TRT which includes a collector, to which a current from the current source IST is supplied. The bipolar transistor TRT is diode-connected with the collector and the base thereof connected, and a temperature detection voltage VTD having temperature characteristics is output to a node of the collector of the bipolar transistor TRT. The temperature characteristics of the temperature detection voltage VTD are generated by the temperature dependence of the base-emitter voltage of the bipolar transistor TRT. As shown in FIG. 12C, the temperature detection voltage VTD has negative temperature characteristics (linear temperature characteristics having a negative gradient).

Figure 12B:
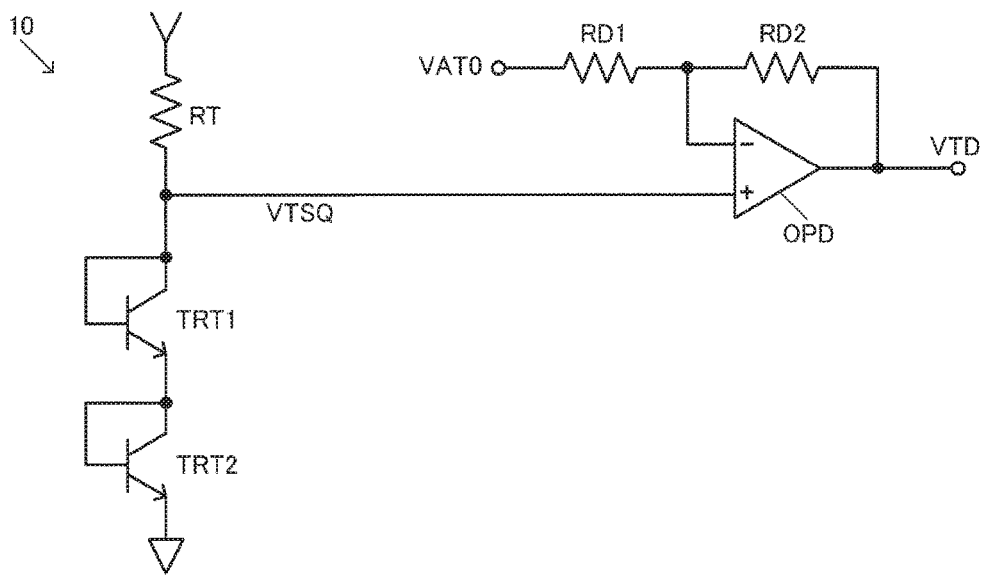
FIG. 12B shows an example configuration of the temperature sensor unit.
Figure 12C:
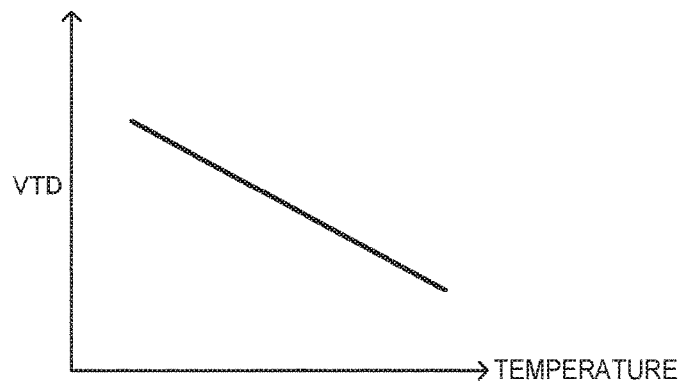
FIG. 12C shows an example of temperature characteristics of the temperature sensor unit.

FIG. 12B shows a second example configuration of the temperature sensor unit 10. In FIG. 12B, the current source IST of FIG. 12A is realized by a resistor RT. One end of the resistor RT is connected to the node of the power supply voltage, and the other end of the resistor RT is connected to the collector of the bipolar transistor TRT1. The emitter of the bipolar transistor TRT1 is connected to the collector of the bipolar transistor TRT2. Both of the bipolar transistors TRT1 and TRT2 are diode-connected, and a voltage VTSQ which is output to the node of the collector of the bipolar transistor TRT1 has negative temperature characteristics (linear temperature characteristics having a negative gradient) as in FIG. 12C.

In the temperature sensor unit 10 of FIG. 12B, an operational amplifier OPD and resistors RD1 and RD2 are further provided. A voltage VTSQ is input to the non-inverting terminal of the operational amplifier OPD, and one end of the resistor RD1 and one end of the resistor RD2 are connected to the inverting terminal of the operational amplifier OPD. A reference temperature voltage VTA0 is supplied to the other end of the resistor RD1, and the other end of the resistor RD2 is connected to the output terminal of the operational amplifier OPD.

With the operational amplifier OPD and the resistors RD1 and RD2, an amplifier circuit which amplifies the voltage VTSQ forward with the reference temperature voltage VAT0 as a reference is configured. With this, the temperature detection voltage VTD=VAT0+(1+RD2/RD1)×(VTSQ−VAT0) is output from the temperature sensor unit 10. Then, a reference temperature T0 can be adjusted by adjusting the reference temperature voltage VAT0.

7. A/D Conversion Unit

Figure 13:
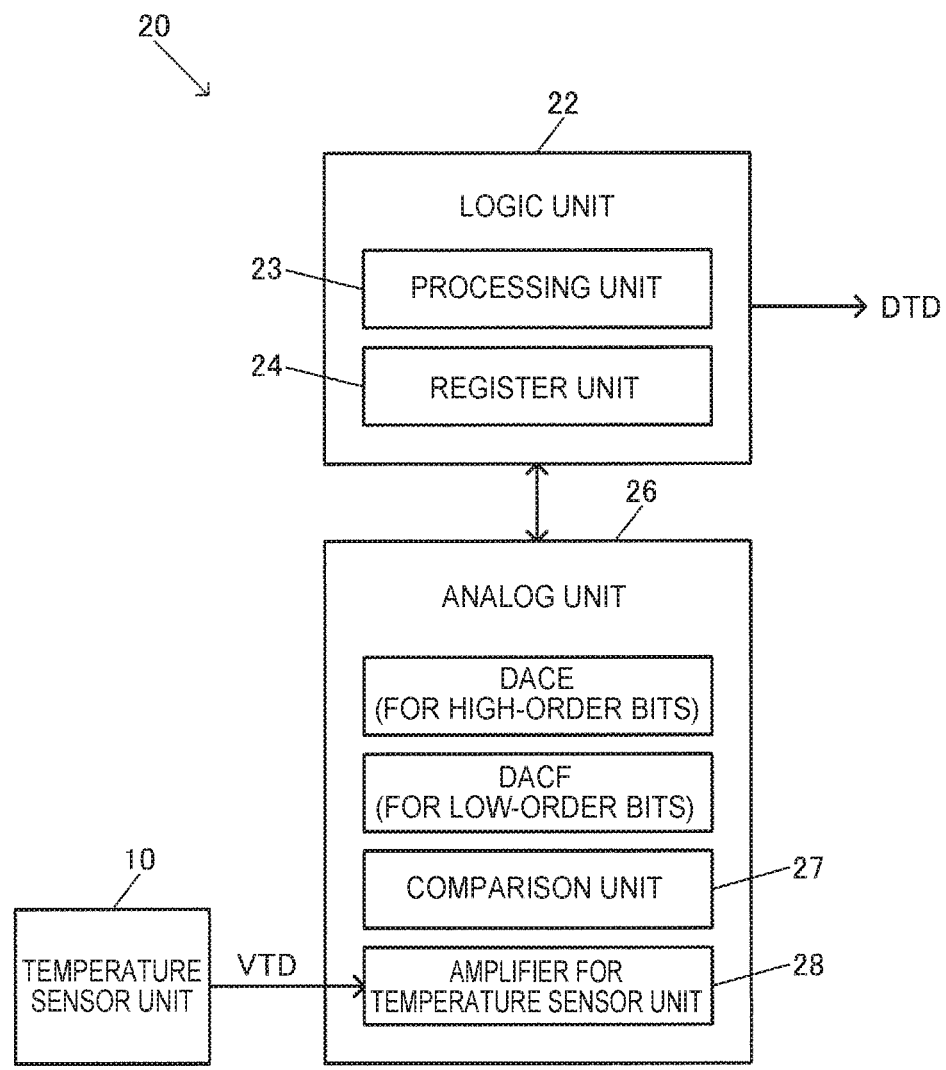
FIG. 13 shows a detailed example configuration of an A/D conversion unit.

FIG. 13 shows a detailed example configuration of the A/D conversion unit 20. The A/D conversion unit 20 includes a processing unit 23, a register unit 24, D/A converters DACE and DACF, and a comparison unit 27. The A/D conversion unit 20 can also include an amplifier 28 for temperature sensor unit. The processing unit 23 and the register unit 24 are provided as a logic unit 22, and the D/A converters DACE and DACF, the comparison unit 27, and the amplifier 28 for temperature sensor unit are provided as an analog unit 26.

The register unit 24 stores result data, such as an interim result or a final result of A/D conversion. The register unit 24 corresponds to, for example, a successive comparison result register in a successive comparison method. The D/A converters DACE and DACF perform D/A conversion of result data of the register unit 24. As DACE and DACF, a D/A converter having the same configuration as that shown in FIG. 11 can be used. The comparison unit 27 compares the output voltages of the D/A converters DACE and DACF with the temperature detection voltage VTD (the voltage after amplification by the amplifier 28 for temperature sensor unit). The comparison unit 27 can be realized by, for example, a chopper-type comparator or the like. The processing unit 23 performs determination processing based on the comparison result of the comparison unit 27 and performs update processing of result data of the register unit 24. Final temperature detection data DTD determined by the update processing is output from the A/D conversion unit 20 as an A/D conversion result of temperature detection voltage VTD. With this configuration, for example, it is possible to realize A/D conversion of a successive comparison method, A/D conversion by a method similar to the successive comparison method, or the like.

8. Modified Configuration Example of Circuit Device

Figure 14:
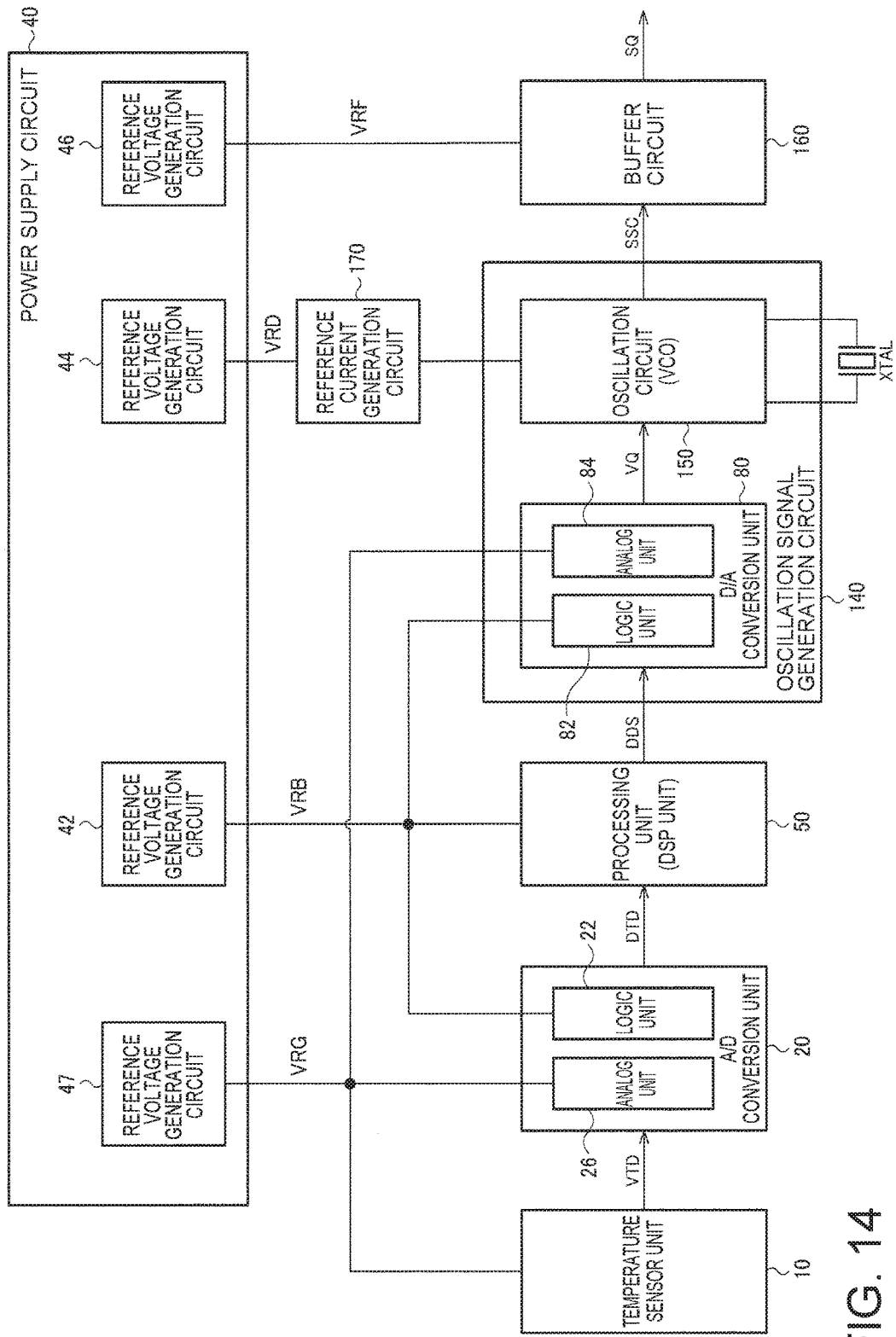
FIG. 14 shows a first modified example configuration of the circuit device.

FIG. 14 shows a first modified example configuration of the circuit device of this embodiment.

The circuit device of FIG. 14 includes a power supply circuit 40, a temperature sensor unit 10, an A/D conversion unit 20, a processing unit 50, an oscillation signal generation circuit 140, and a buffer circuit 160.

In FIG. 14, the power supply circuit 40 includes reference voltage generation circuits 42, 44, 46, and 47. The A/D conversion unit 20 includes an analog unit 26 and a logic unit 22, and the D/A conversion unit 80 includes a logic unit 82 and an analog unit 84. The analog unit 26 and the logic unit 22 of the A/D conversion unit 20 correspond to the analog unit 26 and the logic unit 22 of FIG. 13. The logic unit 82 of the D/A conversion unit 80 corresponds to the modulation circuit 90 of FIGS. 2 and 11, and the analog unit 84 corresponds to the D/A converter 100 and the filter circuit 120 of FIGS. 2 and 11.

The reference voltage generation circuit 47 supplies a reference voltage generated based on the work function difference between the transistors to the temperature sensor unit 10, the analog unit 26 of the A/D conversion unit 20, and the analog unit 84 of the D/A conversion unit 80 as a power supply voltage VRG. The reference voltage generation circuit 42 supplies a reference voltage generated based on the work function difference between the transistors to the logic unit 22 of the A/D conversion unit 20, the processing unit 50, and the logic unit 82 of the D/A conversion unit 80 as a power supply voltage VRB.

As described above referring to FIG. 4 and the like, the power supply circuit 40 may include at least one of a first reference voltage generation circuit which supplies a first reference voltage generated based on the work function difference to the A/D conversion unit 20 as a first power supply voltage, a second reference voltage generation circuit which supplies a second reference voltage generated based on the work function difference to the processing unit 50 as a second power supply voltage, or a third reference voltage generation circuit which supplies a third reference voltage generated based on the work function difference to the D/A conversion unit 80 as a third power supply voltage.

In FIG. 4, a case where the first to third reference voltage generation circuits are provided is shown. FIG. 14 corresponds to a case where two reference voltage generation circuits among the first to third reference voltage generation circuits are provided. That is, since it is considered that the reference voltage generation circuit 47 of FIG. 14 corresponds to the first reference voltage generation circuit or the third reference voltage generation circuit, FIG. 14 is a modified example configuration in a case where the power supply circuit 40 of FIG. 14 includes the first reference voltage generation circuit and the second reference voltage generation circuit, or a case where the power supply circuit 40 of FIG. 14 includes the second reference voltage generation circuit and the third reference voltage generation circuit.

Figure 15:
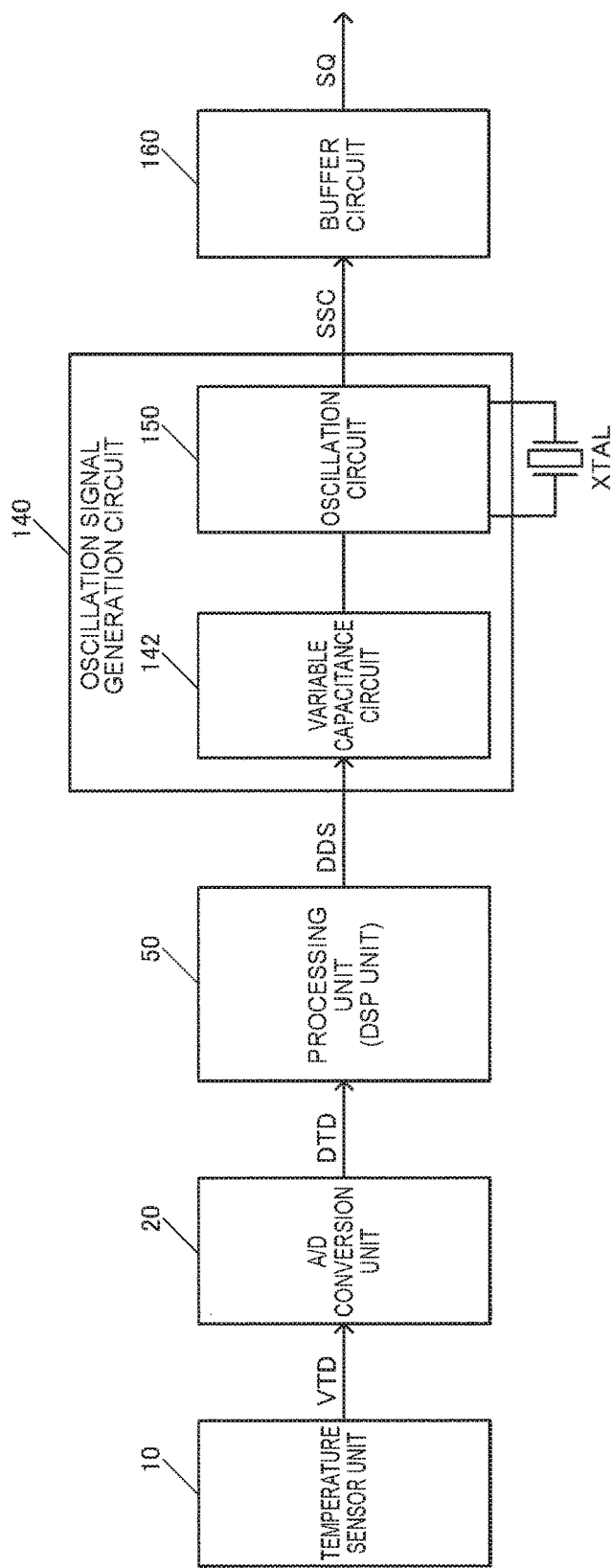
FIG. 15 shows a second modified example configuration of the circuit device.

FIG. 15 shows a second modified example configuration of the circuit device of this embodiment.

The circuit device of FIG. 15 includes an A/D conversion unit 20 which performs A/D conversion of the temperature detection voltage VTD from the temperature sensor unit 10 and outputs temperature detection data DTD, a processing unit 50 which performs temperature compensation processing of the oscillation frequency based on temperature detection data DTD and outputs frequency control data DDS of the oscillation frequency, and an oscillation signal generation circuit 140. In FIG. 15, the power supply circuit 40 is not shown.

The oscillation signal generation circuit 140 generates an oscillation signal SSC of an oscillation frequency set by frequency control data DDS using frequency control data DDS from the processing unit 50 and the vibrator XTAL. That is, in FIG. 15, unlike FIGS. 1, 2, and 4, the D/A conversion unit 80 is not provided in the oscillation signal generation circuit 140. The oscillation frequency of the oscillation signal SSC generated by the oscillation signal generation circuit 140 is controlled directly based on frequency control data DDS from the processing unit 50. That is, the oscillation frequency of the oscillation signal SSC is controlled without passing through the D/A conversion unit.

For example, in FIG. 15, the oscillation signal generation circuit 140 includes a variable capacitance circuit 142 and an oscillation circuit 150. The oscillation signal generation circuit 140 is not provided with the D/A conversion unit 80 of FIGS. 1, 2, and 4. The variable capacitance circuit 142 is provided instead of the variable capacitance capacitor CX1 of FIG. 10, and one end of the variable capacitance circuit 142 is connected to one end of the vibrator XTAL.

The variable capacitance circuit 142 is configured such that a capacitance value thereof is controlled based on frequency control data DDS from the processing unit 50. For example, the variable capacitance circuit 142 includes a plurality of capacitors (capacitor array), and a plurality of switch elements (switch array) which are configured such that the on/off of each switch element is controlled based on frequency control data DDS. Each switch element of a plurality of switch elements is electrically connected to each capacitor of a plurality of capacitors. A plurality of switch elements are switched on or off, whereby the number of capacitors, one end of which is connected to one end of the vibrator XTAL, among a plurality of capacitors changes. With this, the capacitance value of the variable capacitance circuit 142 is controlled, and the capacitance value of one end of the vibrator XTAL changes. Accordingly, the capacitance value of the variable capacitance circuit 142 is controlled directly by frequency control data DDS, whereby the oscillation frequency of the oscillation signal SSC can be controlled.

9. Oscillator, Electronic Apparatus, Moving Object

Figure 16A:
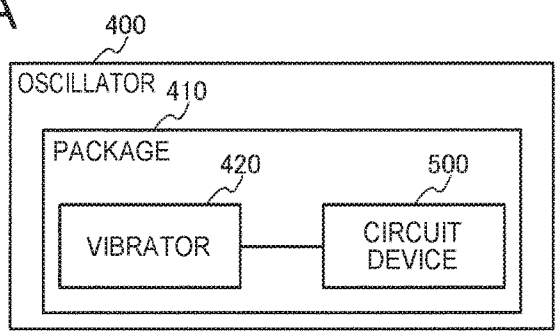
FIG. 16A shows an example configuration of an oscillator.

FIG. 16A shows an example configuration of an oscillator 400 including the circuit device 500 of this embodiment. As shown in FIG. 16A, the oscillator 400 includes a vibrator 420 and a circuit device 500. The vibrator 420 and the circuit device 500 are mounted in a package 410 of the oscillator 400. The terminals of the vibrator 420 and the terminals (pads) of the circuit device 500 (IC) are electrically connected by internal wirings of the package 410.

Figure 16B:
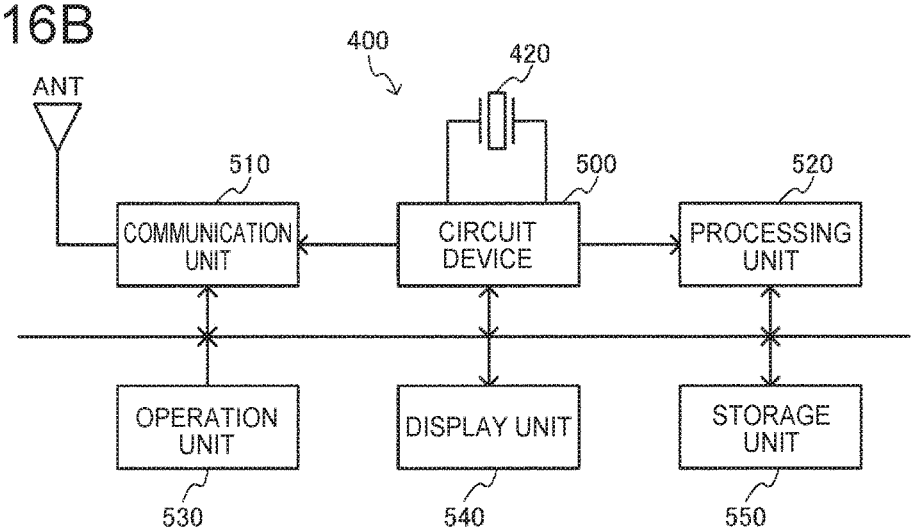
FIG. 16B shows an example configuration of an electronic apparatus.

FIG. 16B shows an example configuration of an electronic apparatus including the circuit device 500 of this embodiment. The electronic apparatus includes the circuit device 500 of this embodiment, a vibrator 420, such as a quartz crystal vibrator, an antenna ANT, a communication unit 510, and a processing unit 520. The electronic apparatus can also include an operation unit 530, a display unit 540, and a storage unit 550. The vibrator 420 and the circuit device 500 constitute an oscillator 400. The electronic apparatus is not limited to the configuration of FIG. 16B, and various modifications can be made in which some constituent elements are omitted, other constituent elements are added, or the like.

As the electronic apparatus of FIG. 16B, for example, various apparatuses including a GPS-equipped timepiece, a biological information measurement apparatus (sphygmograph, pedometer, or the like), a wearable apparatus, such as a head mounted display, a portable information terminal (mobile terminal), such as a smartphone, a mobile phone, a portable game machine, a notebook PC, or a tablet PC, a content providing terminal distributing contents, a video apparatus, such as a digital camera or a video camera, a network-related apparatus, such as a base station or a router, can be assumed.

The communication unit 510 (wireless circuit) performs processing for receiving data from the outside through the antenna ANT or transmitting data to the outside. The processing unit 520 performs control processing of the electronic apparatus, various kinds of digital processing of data transmitted and received through the communication unit 510, and the like. The functions of the processing unit 520 can be realized by, for example, a processor, such as a microcomputer.

The operation unit 530 is used when the user performs an input operation, and can be realized by operation buttons, a touch panel display, or the like. The display unit 540 displays various kinds of information, and can be realized by a display, such as a liquid crystal or organic EL display. In a case where a touch panel display is used as the operation unit 530, the touch panel display has the functions of both of the operation unit 530 and the display unit 540. The storage unit 550 stores data, and the functions thereof can be realized by a semiconductor memory, such as a RAM or a ROM, a hard disk drive (HDD), or the like.

Figure 16C:
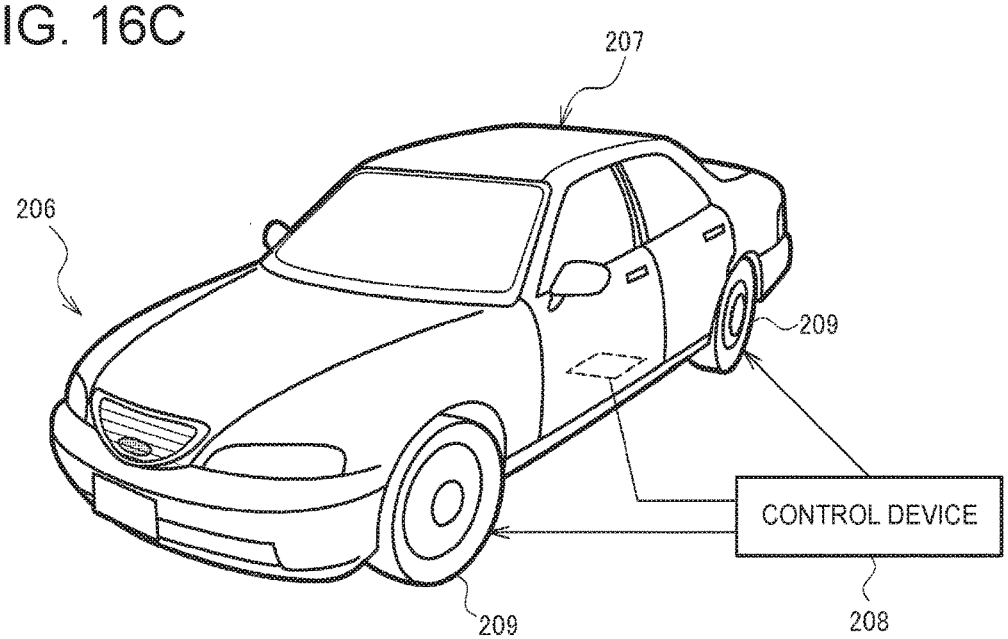
FIG. 16C shows an example of a moving object.

FIG. 16C shows an example of a moving object including the circuit device of this embodiment. The circuit device (oscillator) of this embodiment can be incorporated in, for example, various moving objects, such as an automobile, an airplane, a motorcycle, a bicycle, and a ship. The moving object is, for example, an apparatus/device which includes a drive mechanism, such as an engine or a motor, a steering mechanism, such as a steering wheel or a tiller, and various electronic apparatuses (on-vehicle apparatuses) and moves on the ground, in the air, or on the sea. FIG. 16C schematically shows an automobile 206 as a specific example of a moving object. The automobile 206 is incorporated with an oscillator (not shown) having the circuit device of this embodiment and the vibrator. A control device 208 operates with a clock signal generated by the oscillator. The control device 208 controls the hardness of a suspension or brakes of respective wheels 209 according to, for example, the posture of a vehicle body 207. For example, automatic driving of the automobile 206 may be realized by the control device 208. An apparatus in which the circuit device of this embodiment or the oscillator is incorporated is not limited to the control device 208, and can be incorporated in various apparatuses (on-vehicle apparatuses) which are provided in a moving object, such as the automobile 206.

Although this embodiment will be described in detail as described above, it can be easily understood by those skilled in the art that various modifications can be made without substantially departing from the new matters and effects of the present disclosure. Accordingly, such modification examples are all included within the scope of the present disclosure. For example, in the specification or the drawings, the terminology described at least once together with different terminology which has broader or the same definition can be replaced by the different terminology in any parts of the specification or the drawings. Furthermore, all combinations of this embodiment and the modification examples are also included within the scope of the present disclosure. In addition, the configurations, the operations, and the like of the circuit device, the oscillator, the electronic apparatus, and the moving object are not limited to those described in this embodiment, and various modification examples can be made.

This application claims priority to Japanese Patent Application No. 2015-221729 filed on Nov. 12, 2015. The entire disclosure of Japanese Patent Application No. 2015-221729 is hereby incorporated herein by reference.

What is claimed is:

1. A circuit device comprising:
a power supply circuit configured to receive external power and includes at least one reference voltage generation circuit, wherein the at least one reference voltage generation circuit includes a first transistor and a second transistor arranged in a differential pair configuration, wherein the first transistor is an enhancement-type transistor having a first threshold voltage and the second transistor is a depletion-type transistor having a second threshold voltage, wherein the at least one reference voltage generation circuit generates a reference voltage based on a work function difference between the first transistor and the second transistor, wherein the work function difference corresponds to a difference between the first threshold voltage and the second threshold voltage, and wherein the power supply circuit supplies the reference voltage generated by the reference voltage generation circuit as a power supply voltage; and
a digital temperature compensated oscillation circuit that is operated when the power supply voltage is supplied from the power supply circuit,
wherein the digital temperature compensated oscillation circuit includes
an A/D converter configured to convert a temperature detection voltage from a temperature sensor to temperature detection data,
a processing circuit configured to execute a temperature compensation process on an oscillation frequency based on the temperature detection data and to output frequency control data of the oscillation frequency, and
an oscillation signal generation circuit configured to generate an oscillation signal using the frequency control data from the processing circuit and a vibrator, wherein the oscillation signal has the oscillation frequency set by the frequency control data.

2. The circuit device according to claim 1,
wherein:
the oscillation signal generation circuit includes:
a D/A converter configured to convert the frequency control data and to a frequency control voltage of the oscillation frequency, and
an oscillation circuit configured to oscillate a vibrator at the oscillation frequency based on the frequency control voltage, and
the power supply circuit includes, as the at least one reference voltage generation circuit, at least one of:
a first reference voltage generation circuit configured to supply a first reference voltage generated based on the work function difference to the A/D converter, as a first power supply voltage,
a second reference voltage generation circuit configured to supply a second reference voltage generated based on the work function difference to the processing circuit, as a second power supply voltage, and
a third reference voltage generation circuit configured to supply a third reference voltage generated based on the work function difference to the D/A converter, as a third power supply voltage.

3. The circuit device according to claim 1, further comprising:
a reference current generation circuit configured to generate a reference current based on the reference voltage,
wherein the oscillation signal generation circuit includes an oscillation circuit that oscillates the vibrator with a drive current based on the reference current.

4. The circuit device according to claim 3,
wherein the reference current generation circuit includes
a third transistor that is provided between a high potential-side power supply node and a first node,
a fourth transistor that is provided between the first node and a second node,
a first operational amplifier that includes a first input node, to which the reference voltage is input, a second input node connected to the second node, and an output node connected to the gate of the third transistor, and
a second operational amplifier that includes a first input node, to which a predetermined voltage for setting the voltage of the first node is input, a second input node connected to the first node, and an output node connected to the gate of the fourth transistor.

5. The circuit device according to claim 1,
wherein the at least one reference voltage generation circuit includes:
a first current mirror circuit that supplies a current to the first transistor and the second transistor,
a first resistor that includes one end, to which a voltage corresponding to the work function difference voltage between the first transistor and the second transistor is applied, and
a third transistor that is provided between a power supply node and the one end of the first resistor and in which a gate voltage is controlled based on a drain voltage of the second transistor, and
the at least one reference voltage generation circuit outputs a voltage of the one end of the first resistor as the reference voltage.

6. The circuit device according to claim 5,
wherein the power supply node is a high potential-side power supply node.

7. The circuit device according to claim 5,
wherein the at least one reference voltage generation circuit includes:
a fourth transistor,
a fifth transistor that includes a gate electrode having conductivity different from that of the gate electrode of the fourth transistor,
a second current mirror circuit that supplies a current to the fourth transistor and the fifth transistor,
a second resistor that includes one end, to which a voltage corresponding to a work function difference voltage between the fourth transistor and the fifth transistor is applied, and
a sixth transistor that is provided between a high potential-side power supply node and the one end of the second resistor and in which a gate voltage is controlled based on a drain voltage of the fifth transistor, and
the at least one reference voltage generation circuit outputs a voltage of the one end of the second resistor to the power supply node.

8. The circuit device according to claim 5,
wherein the at least one reference voltage generation circuit includes:
a fourth transistor,
a fifth transistor that includes a gate electrode having conductivity different from that of the gate electrode of the fourth transistor,
a current mirror circuit that supplies a current to the fourth transistor and the fifth transistor, and
an sixth transistor that is provided between a high potential-side power supply node and the gate of the fifth transistor and in which a gate voltage is controlled based on a drain voltage of the fifth transistor, and
the at least one reference voltage generation circuit outputs a drain voltage of the sixth transistor as a voltage corresponding to a work function difference voltage between the fourth transistor and the fifth transistor to the power supply node.

9. The circuit device according to claim 7,
wherein the third transistor is a depletion type transistor.

10. The circuit device according to claim 5,
wherein the at least one reference voltage generation circuit includes a capacitor that is provided between a gate node of the third transistor and a low potential-side power supply node.

11. An oscillator comprising:
the circuit device according to claim 1; and
the vibrator.

12. An electronic apparatus comprising:
the circuit device according to claim 1.

13. The electronic apparatus according to claim 12, further comprising:
a switching regulator that supplies the external power.

14. A moving object comprising:
the circuit device according to claim 1.

15. A circuit device comprising:
a power supply circuit including at least one reference voltage generation circuit, wherein the at least one reference voltage generation circuit includes a first transistor and a second transistor arranged in a differential pair configuration, wherein the first transistor is an enhancement-type transistor having a first threshold voltage and the second transistor is a depletion-type transistor having a second threshold voltage, wherein the at least one reference voltage generation circuit generates a reference voltage based on a work function difference between the first transistor and the second transistor, and wherein the work function difference corresponds to a difference between the first threshold voltage and the second threshold voltage; and
a digital temperature compensated oscillation circuit configured to receive the reference voltage from the power supply circuit, wherein the digital temperature compensated oscillation circuit includes:
an analog-to-digital convertor that converts a temperature detection voltage from a temperature sensor unit to a temperature detection data,
a processing unit that performs temperature compensation processing of an oscillation frequency based on the temperature detection data and outputs frequency control data of the oscillation frequency, and
an oscillation signal generation circuit that generates an oscillation signal by way of a vibrator based on the frequency control data from the processing unit, wherein a frequency of the oscillation signal is the oscillation frequency set by the frequency control data.

* * * * *